(12) United States Patent
Cho et al.

(10) Patent No.: US 8,564,125 B2
(45) Date of Patent: Oct. 22, 2013

(54) INTEGRATED CIRCUIT PACKAGING SYSTEM WITH EMBEDDED THERMAL HEAT SHIELD AND METHOD OF MANUFACTURE THEREOF

(75) Inventors: NamJu Cho, Uiwang-si (KR); HeeJo Chi, Ichon-si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 105 days.

(21) Appl. No.: 13/224,718

(22) Filed: Sep. 2, 2011

(65) Prior Publication Data

US 2013/0056864 A1 Mar. 7, 2013

(51) Int. Cl.
*H01L 23/34* (2006.01)

(52) U.S. Cl.
USPC ......................................................... 257/713

(58) Field of Classification Search
USPC ........... 257/E25.031–E25.032, E23.042, 276, 257/625, 675, E33.075, E31.131, E23.051, 257/E23.08–E23.113, 678–733, 787–796, 257/E23.001–E23.194, E21.499–E21.519; 438/6, 28, 66, 67, 107, 109, 406, 438/455–459, 122, 15, 26, 5, 55, 64, 106, 438/124
See application file for complete search history.

(56) References Cited

U.S. PATENT DOCUMENTS

| | | | | |
|---|---|---|---|---|
| 7,288,835 | B2 * | 10/2007 | Yim et al. | 257/685 |
| 7,683,469 | B2 * | 3/2010 | Oh et al. | 257/686 |
| 7,751,190 | B2 * | 7/2010 | Fujiwara | 361/700 |
| 2006/0091516 | A1 * | 5/2006 | Matsunami | 257/686 |
| 2006/0197209 | A1 * | 9/2006 | Choi et al. | 257/686 |
| 2007/0029648 | A1 * | 2/2007 | Gerber et al. | 257/666 |
| 2007/0210424 | A1 * | 9/2007 | Ho et al. | 257/678 |
| 2009/0212408 | A1 * | 8/2009 | Choi et al. | 257/686 |
| 2009/0294941 | A1 * | 12/2009 | Oh et al. | 257/686 |
| 2012/0241967 | A1 * | 9/2012 | Kim et al. | 257/773 |

OTHER PUBLICATIONS

U.S. Appl. No. 13/070,219, filed Mar. 23, 2011, Kim et al.

\* cited by examiner

*Primary Examiner* — Dao H Nguyen
*Assistant Examiner* — Tram H Nguyen
(74) *Attorney, Agent, or Firm* — Ishimaru & Associates LLP

(57) ABSTRACT

A method of manufacture of an integrated circuit packaging system includes: mounting a bottom integrated circuit on a bottom substrate having a peripheral thermal via connected to a peripheral thermal interconnect; mounting an inner heat shield, having a top planar portion, over the bottom integrated circuit with the inner heat shield connected to the peripheral thermal via; mounting a top integrated circuit over the inner heat shield; and forming a package encapsulation over the bottom integrated circuit, the inner heat shield, and the top integrated circuit with the top planar portion exposed only at each corners of a package topside of the package encapsulation.

18 Claims, 12 Drawing Sheets

INTEGRATED CIRCUIT PACKAGING SYSTEM WITH EMBEDDED THERMAL HEAT SHIELD AND METHOD OF MANUFACTURE THEREOF

TECHNICAL FIELD

The present invention relates generally to an integrated circuit packaging system, and more particularly to a system for cooling the integrated circuit.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant die periphery between the current semiconductor capability and the available supporting electronic packaging technologies. The limitations and issues with current technologies include increasing clock rates, EMI radiation, thermal loads, second level assembly reliability stresses and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting a bottom integrated circuit on a bottom substrate having a peripheral thermal via connected to a peripheral thermal interconnect; mounting an inner heat shield, having a top planar portion, over the bottom integrated circuit with the inner heat shield connected to the peripheral thermal via; mounting a top integrated circuit over the inner heat shield; and forming a package encapsulation over the bottom integrated circuit, the inner heat shield, and the top integrated circuit with a top planar portion exposed only at each corners of a package topside of the package encapsulation.

The present invention provides an integrated circuit packaging system, including: a bottom integrated circuit on a bottom substrate having a peripheral thermal via connected to a peripheral thermal interconnect; an inner heat shield, having a top planar portion, over the bottom integrated circuit with the inner heat shield connected to the peripheral thermal via; a top integrated circuit over the inner heat shield; and a package encapsulation over the bottom integrated circuit, the inner heat shield, and the top integrated circuit with the top planar portion exposed only at each corners of a package topside of the package encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
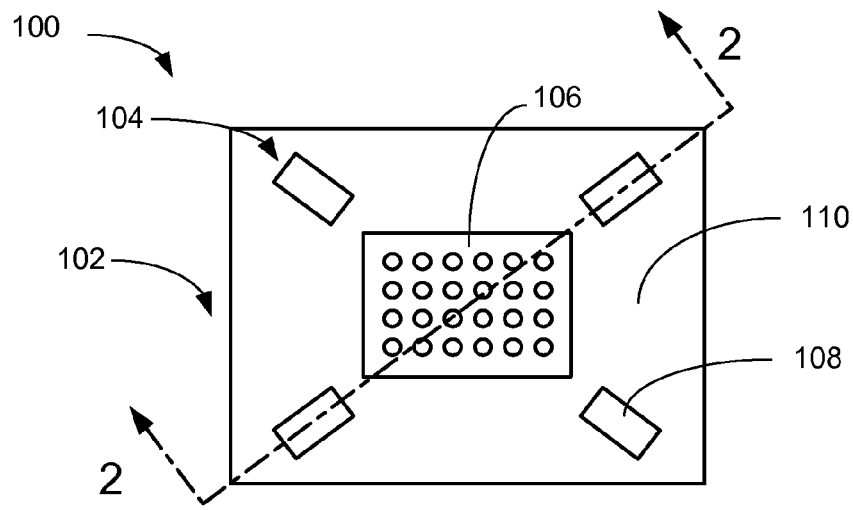
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can include a package encapsulation 102. The package encapsulation 102 is defined as a cover surrounding and protecting the contents in the integrated circuit packaging system 100 from the environment and hermetically seals the contents internal to the integrated circuit packaging system 100. The package encapsulation 102 can be an epoxy molding compound, protective molding, or encasement structure.

The integrated circuit packaging system 100 can include an inner heat shield 104, which is defined as a conductive structure that transfers heat generated within the integrated circuit packaging system 100 to the external environment. The term "external" refers to outside the integrated circuit packaging system 100. For example, the inner heat shield 104 can be a heat spreader or an electromagnetic interference (EMI) shield.

A top planar portion 108 of the inner heat shield 104 can be exposed from a package topside 110 of the package encapsulation 102. For example, a topside of the top planar portion 108 can be exposed only at the corners of the package topside 110 of the package encapsulation 102. The top planar portion 108 can be evenly spaced at the corners of the package topside 110 of the package encapsulation 102.

The integrated circuit packaging system 100 can include a top substrate 106, which is defined as a mounting structure for an integrated circuit or other electrical components as well as providing electrical connections between, to, and from the integrated circuit packaging system 100. For example, the top substrate 106 can be exposed from the center of the package topside 110 of the package encapsulation 102.

It has been discovered that the exposure of the topside of the top planar portion 108 at the corners of the package topside 110 allows the evenly spaced dissipation of heat from the center or interior of the integrated circuit packaging system 100 to the external environment. The exposure of the top planar portion 108 only at the corners of the package topside 110 leaves maximum mounting surface on top of the package encapsulation 102.

Figure 2:
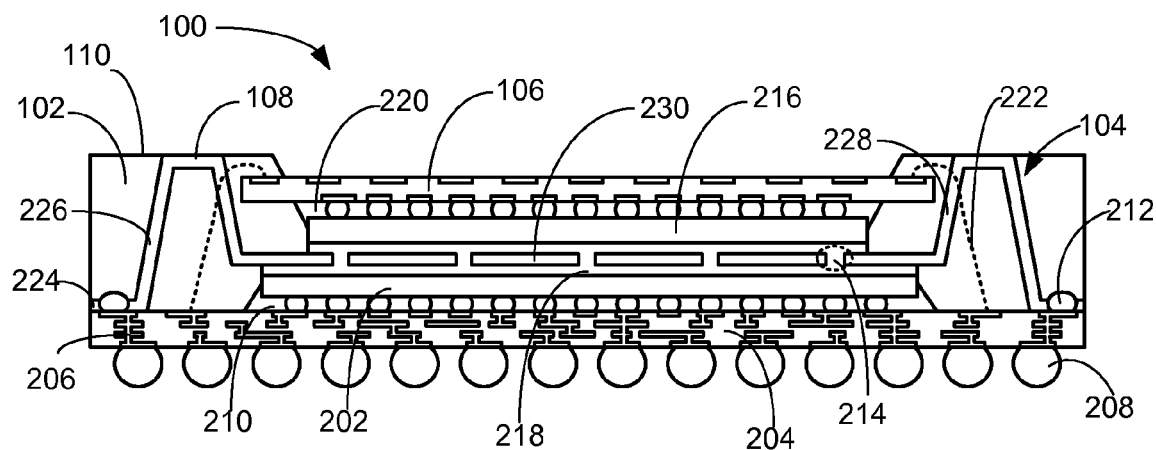
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 can in include a bottom integrated circuit 202 on a bottom substrate 204 having a peripheral thermal via 206 connected to a peripheral thermal interconnect 208.

The bottom substrate 204 is defined as a mounting structure for an integrated circuit or other electrical components as well as providing electrical connections between, to, and from the devices mounted thereto. For example, the bottom integrated circuit 202 can be mounted over the topside of the bottom substrate 204.

The bottom integrated circuit 202 is defined as chip with active circuitry fabricated thereon. For example, the bottom integrated circuit 202 can include a flip chip, a wire bonded chip, or a packaged integrated circuit. For further example, the bottom integrated circuit 202 can be mounted over the bottom substrate 204 with a bottom underfill 210, which is defined as a structure that provides adhesion and rigidity for mounting an integrated circuit or electrical component on other integrated circuit or electrical component. For example, the bottom underfill 210 can include a liquid epoxy mixture that provides rigidity and adhesion.

The peripheral thermal via 206 is defined as a hole filled with electrically conductive material that provides a thermal path, a conductive path, or a combination thereof. For example, the peripheral thermal via 206 can support the ground connection for the inner heat shield 104. The peripheral thermal interconnect 208 is defined as a connection interface for thermal connection to other external components. For example, the peripheral thermal interconnect 208 can include solder columns, solder balls, or conductive interconnects.

The integrated circuit packaging system 100 can include a peripheral conductive adhesive 212, which is defined as a thermally conductive material for holding components in place. For example, the peripheral conductive adhesive 212 can include gel, thermally conductive epoxy, or thermally conductive polymer. For further example, the peripheral conductive adhesive 212 can attach the inner heat shield 104 to the topside of the bottom substrate 204. For specific example, the peripheral conductive adhesive 212 can attach the inner heat shield 104 to the peripheral thermal via 206 within the bottom substrate 204.

The integrated circuit packaging system 100 can include the inner heat shield 104 over the bottom integrated circuit 202 with the inner heat shield 104 connected to the peripheral thermal via 206. For example, the inner heat shield 104 can represent a solid plate or can include a plate hole 214.

The plate hole 214 is defined as an opening on the inner heat shield 104. For example, the inner heat shield 104 can include multiple numbers of the plate hole 214. For further example, the plate hole 214 can come in shapes of circle, triangle, square, or a combination thereof. For a specific example, the inner heat shield 104 can have the plate hole 214 with the inner heat shield 104 between the bottom integrated circuit 202 and a top integrated circuit 216. More specifically, the inner heat shield 104 having the plate hole 214 can dissipate heat and can stabilize and lock an inner thermal adhesive 218 applied over the inner heat shield 104 between the bottom integrated circuit 202 and the top integrated circuit 216.

The inner heat shield 104 can include a foot 224. The peripheral conductive adhesive 212 can connect the foot 224 to the peripheral thermal via 206. The inner heat shield 104 can include a peripheral leg 226 extending from the foot 224. The top planar portion 108 of the inner heat shield 104 can extend from the peripheral leg 226 with the topside of the top planar portion 108 exposed. For another example, the top planar portion 108 can be parallel with the topside of the bottom substrate 204.

An inner support leg 228 of the inner heat shield 104 can extend from the top planar portion 108. The peripheral leg 226 and the inner support leg 228 can connect to the top planar portion 108 in an obtuse angle with the obtuse angle facing towards the bottom substrate 204. For example, the inner support leg 228 can be greater than half of the length of the peripheral leg 226.

A central planar portion 230 of the inner heat shield 104 can extend from the inner support leg 228. The central planar portion 230 can extend over the bottom integrated circuit 202 to connect to the inner support leg 228 on the opposite end of the inner heat shield 104.

It has been discovered that placing the inner heat shield 104 on the bottom substrate 204 provides better manufacturability of the integrated circuit packaging system 100. By focusing the placement of the inner heat shield 104 on the bottom substrate 204, the production speed increases, thus, lowering the production cost.

The integrated circuit packaging system 100 can include the inner thermal adhesive 218, which is defined as a single structure that is thermally conductive material for holding components in place. For example, the inner thermal adhesive 218 can include gel, thermally conductive epoxy, or thermally conductive polymer. The inner thermal adhesive 218 can cover a topside and a bottom side of the central planar portion 230 of the inner heat shield 104. More specifically, the inner thermal adhesive 218 can cover the non-active side of the bottom integrated circuit 202 and the top integrated circuit 216.

The integrated circuit packaging system 100 can include the top integrated circuit 216 mounted over the top substrate 106. The top integrated circuit 216 is defined as chip with active circuitry fabricated thereon. For example, the top integrated circuit 216 can include a flip chip, a wire bonded chip, or a packaged integrated circuit. Continuing with the example, the active side of the top integrated circuit 216 and the active side of the bottom integrated circuit 202 can face away from the inner heat shield 104.

For further example, the top integrated circuit 216 can be mounted over the top substrate 106 with a top underfill 220, which is defined as a structure that provides adhesion and rigidity for mounting an integrated circuit or electrical component on other integrated circuit or electrical component. For example, the top underfill 220 can include a liquid epoxy mixture that provides rigidity and adhesion.

It has been discovered that having the inner heat shield 104, between the bottom integrated circuit 202 and the top integrated circuit 216, connected to the peripheral thermal via 206 improves the thermal performance of the integrated circuit packaging system 100. Having the inner heat shield 104 embedded between the bottom integrated circuit 202 and the top integrated circuit 216 improves efficiency for heat dissipation for both integrated circuits.

It has been also discovered that the inner heat shield 104 can provide electromagnetic isolation between the bottom integrated circuit 202 and the top integrated circuit 216 to avoid electromagnetic interference between the two integrated circuits. The peripheral thermal via 206 is connected to the peripheral thermal interconnect 208, which provides further dissipation of heat from the integrated circuit packaging system 100. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 100 can include an electrical interconnect 222, which is defined as a connection interface for electrical connection to other components. For example, the electrical interconnect 222 can include a bondwire, solder columns, solder balls, or conductive interconnects. For this example, the electrical interconnect 222 can represent a bondwire for z-interconnect between the top substrate 106 and the bottom substrate 204. For illustrative purposes, the electrical interconnect 222 is drawn as a dotted line to show that the cross-sectional view can show more than one of the electrical interconnect 222.

The package encapsulation 102 can be formed over the bottom integrated circuit 202, the inner heat shield 104, and the top integrated circuit 216 with the top planar portion 108 of the inner heat shield 104 coplanar with the package topside 110 of the package encapsulation 102. For example, the package encapsulation 102 can be formed with the topside of the top substrate 106 exposed.

It has been discovered the connection between the inner heat shield 104 and the peripheral thermal via 206 and the top planar portion 108 being exposed at the package topside 110 of the package encapsulation 102 allows the evenly spaced dissipation of heat from the center or interior of the integrated circuit packaging system 100 to the external environment. This evenly spaced and maximum separation allow maximum thermal conduction path away from the heat generating integrated circuits to the external environment.

Figure 3:
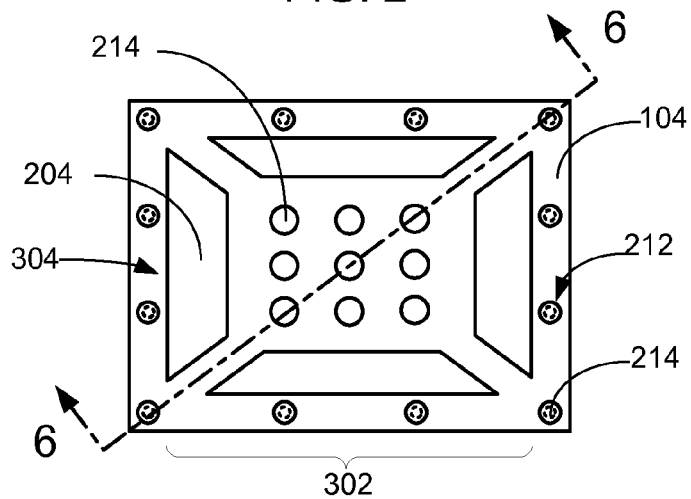
FIG. 3 is a top view of the inner heat shield with a side bar for manufacture of the integrated circuit packaging system of FIG. 1 after mounting phase of the manufacture.

Referring now to FIG. 3, therein is shown a top view of the inner heat shield 104 with a side bar 302 for manufacture of the integrated circuit packaging system 100 of FIG. 1 after mounting phase of the manufacture. The side bar 302 is defined as the inner heat shield 104 placed on the periphery of the top side of the bottom substrate 204. For example, the inner heat shield 104 can include the side bar 302 to cover the periphery along the singulation edge of the top side of the bottom substrate 204. The side bar 302 of the inner heat shield 104 can include the plate hole 214. The plate hole 214 can be covered by the peripheral conductive adhesive 212.

For further example, the inner heat shield 104 can be a continuous path from one corner of the topside of the bottom substrate 204 to another corner of the topside of the bottom substrate 204. More specifically, the inner heat shield 104 can provide a continuous path to connect to the peripheral thermal via 206 of FIG. 2 at one corner of the bottom substrate 204 and can connect to the peripheral thermal via 206 at another corner of the bottom substrate 204.

For another example, the side bar 302 can connect the inner heat shield 104 at one corner of the topside of the bottom substrate 204 to the inner heat shield 104 at another corner of the topside of the bottom substrate 204 that is perpendicular to the first corner. The connection between the inner heat shield 104 and the side bar 302 can create a heat shield opening 304 exposing the topside of the bottom substrate 204.

For different example, the plate hole 214 can be formed along the side bar 302. More specifically, the inner heat shield 104 having the plate hole 214 can be evenly spaced along the periphery of the topside of the side bar 302. Furthermore, the peripheral conductive adhesive 212 can cover the plate hole 214 for the plate hole 214 at the corner of the topside of the bottom substrate 204 and along the topside of the side bar 302. In contrast, the plate hole 214 in the center area of the inner heat shield 104 can be exposed.

It has been discovered that the side bar 302 allows the evenly spaced dissipation of heat from the center or interior of the integrated circuit packaging system 100 to the external environment. More specifically, the side bar 302 allows the dissipation of heat through the bottom substrate 204 of FIG. 4 away from the integrated circuit. Along with the exposure of the top planar portion 108 of FIG. 1 at each corners of the package topside 110, the side bar 302 allows maximum dissipation of heat from the interior and the center of the integrated circuit packaging system 100.

Figure 4:
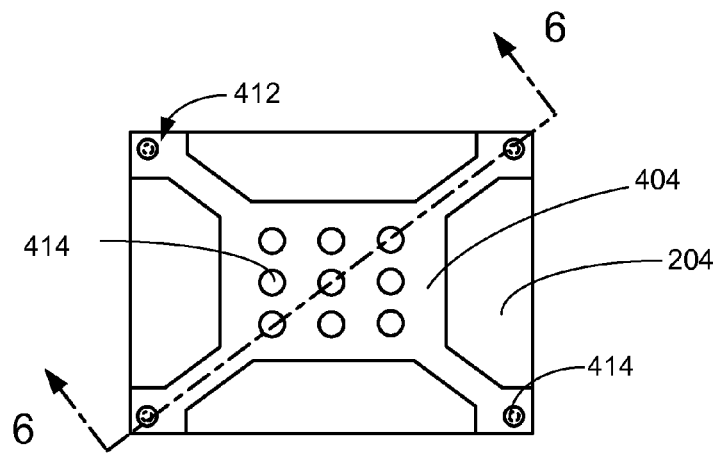
FIG. 4 is a top view of an inner heat shield without the side bar of FIG. 3 for manufacture of the integrated circuit packaging system of FIG. 1 after mounting phase of the manufacture.

Referring now to FIG. 4, therein is shown a top view of an inner heat shield 404 without the side bar 302 of FIG. 3 for manufacture of the integrated circuit packaging system 100 of FIG. 1 after mounting phase of the manufacture. The inner heat shield 404 can be used in the integrated circuit packaging system 100 as well as the inner heat shield 104 of FIG. 3.

The inner heat shield 404 is defined as a conductive structure that transfers heat generated within the integrated circuit packaging system 100 to the external environment. The term "external" refers to outside the integrated circuit packaging system 100. For example, the inner heat shield 404 can be a heat spreader or an electromagnetic interference (EMI) shield.

For example, the inner heat shield 404 can include a plate hole 414. The plate hole 414 can be covered by a peripheral conductive adhesive 412.

For further example, the inner heat shield 404 can be a continuous path from one corner of the bottom substrate 204 to another corner of the bottom substrate 204. More specifically, the inner heat shield 404 can form a continuous path to connect to the peripheral thermal via 206 of FIG. 2 at one corner of the bottom substrate 204 and can connect to the peripheral thermal via 206 at another corner of the bottom substrate 204.

It has been discovered that the inner heat shield 404 without the side bar 302 allows additional mounting option for connecting signals to the next system level that otherwise be used for the heat dissipation path through the side bar 302. The additional mounting option can improve the efficiency and performance of the integrated circuit packaging system 100 by allowing additional signal connection to the next system level.

Figure 5:
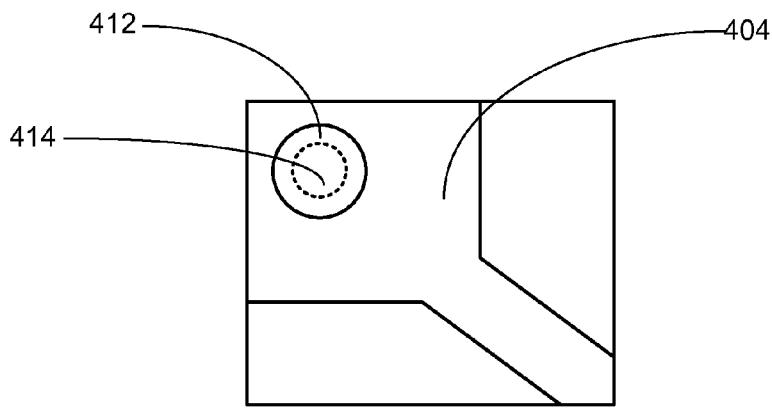
FIG. 5 is a close up view of the inner heat shield of FIG. 4.

Referring now to FIG. 5, therein is shown a close up view of the inner heat shield 404 of FIG. 4. The inner heat shield 404 can include the peripheral conductive adhesive 412 over the plate hole 414.

Figure 6:
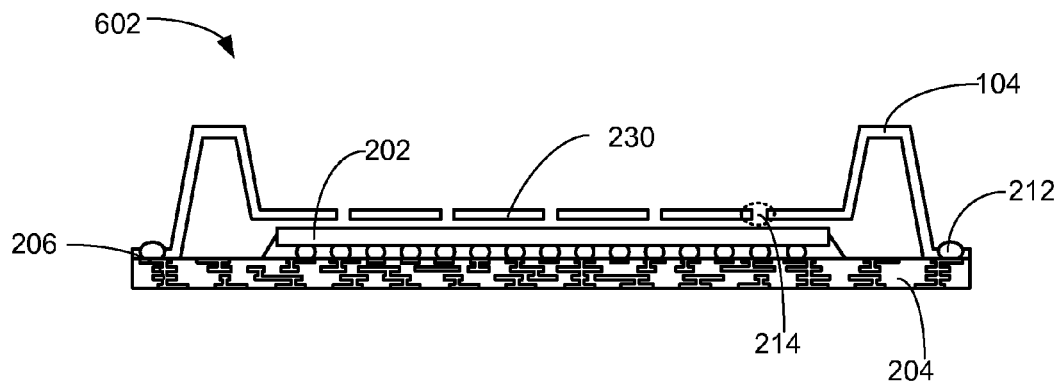
FIG. 6 is a cross-sectional view of a structure along the line 6-6 of FIG. 3 or FIG. 4 for manufacture of the integrated circuit packaging system of FIG. 1 after mounting phase of the manufacture.

Referring now to FIG. 6, therein is shown a cross-sectional view of a structure 602 along the line 6-6 of FIG. 3 or FIG. 4 for manufacture of the integrated circuit packaging system 100 of FIG. 1 after mounting phase of the manufacture. For clarity, the inner heat shield 104 of FIG. 3 will be used going forward.

The structure 602 can include the inner heat shield 104 having the plate hole 214 can be over the bottom substrate 204 having the bottom integrated circuit 202. As a specific example, the central planar portion 230 of the inner heat shield 104 does not contact the bottom integrated circuit 202.

The bottom integrated circuit 202 can include the peripheral thermal via 206. The inner heat shield 104 can be connected to the peripheral thermal via 206 by attaching the inner heat shield 104 to the bottom substrate 204 with the peripheral conductive adhesive 212. Moreover, the peripheral thermal via 206 at one end of the bottom substrate 204 can thermally connect with the peripheral thermal via 206 at another end of the bottom substrate 204 through the inner heat shield 104.

Figure 7:
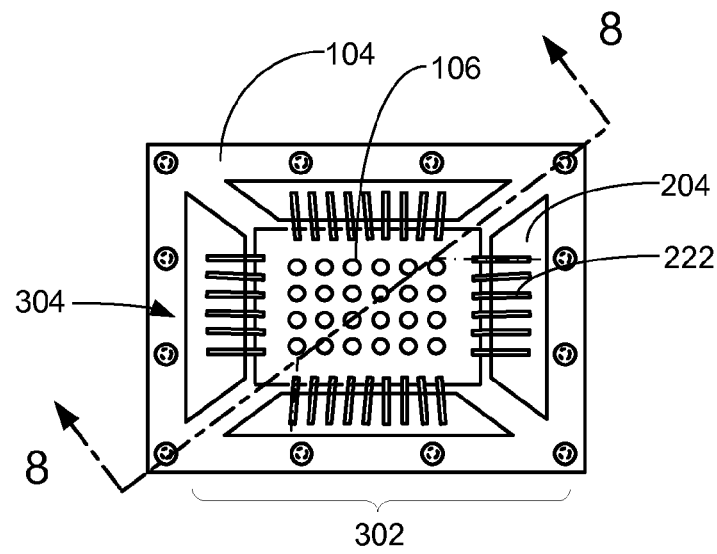
FIG. 7 is a top view of the structure of FIG. 6 in a connection phase of manufacture.

Referring now to FIG. 7, therein is shown a top view of the structure 602 of FIG. 6 in a connection phase of manufacture. For example, the top substrate 106 can be mounted over the bottom substrate 204 and the inner heat shield 104. The inner heat shield 104 can include the side bar 302. The connection between the inner heat shield 104 and the side bar 302 can form the heat shield opening 304.

The top substrate 106 can electrically connect to the bottom substrate 204 with the electrical interconnect 222. For example, the electrical interconnect 222 can be connected through the heat shield opening 304 to the topside of the bottom substrate 204.

Figure 8:
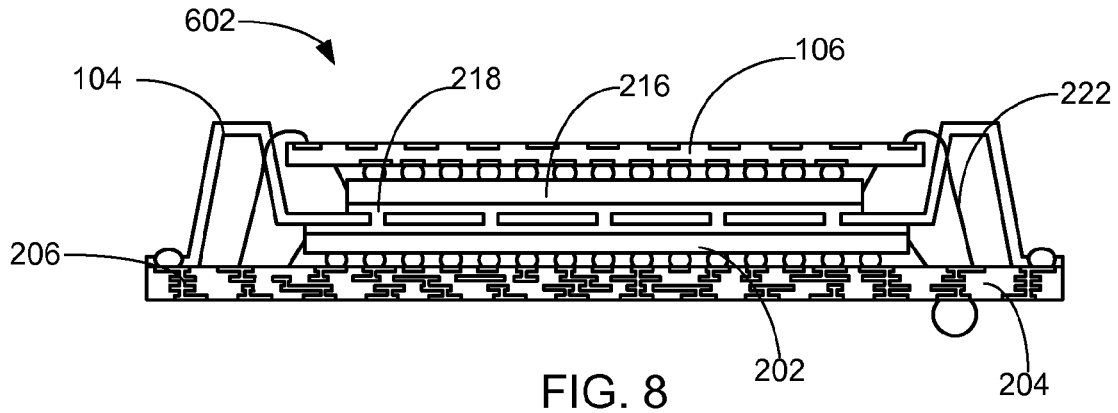
FIG. 8 is a cross-sectional view of the structure along the line 8-8 of FIG. 7 for manufacture of the integrated circuit packaging system of FIG. 1 after connection phase of the manufacture.

Referring now to FIG. 8, therein is shown a cross-sectional view of the structure 602 along the line 8-8 of FIG. 7 for manufacture of the integrated circuit packaging system 100 of FIG. 1 after connection phase of the manufacture. The inner thermal adhesive 218 can be applied between the top integrated circuit 216 and the bottom integrated circuit 202. The top substrate 106 can electrically connect to the bottom substrate 204 with the electrical interconnect 222. For example, the electrical interconnect 222 is drawn with a solid line to show that cross-sectional view includes the electrical interconnect 222. The inner heat shield 104 can thermally connect to the peripheral thermal via 206.

Figure 9:
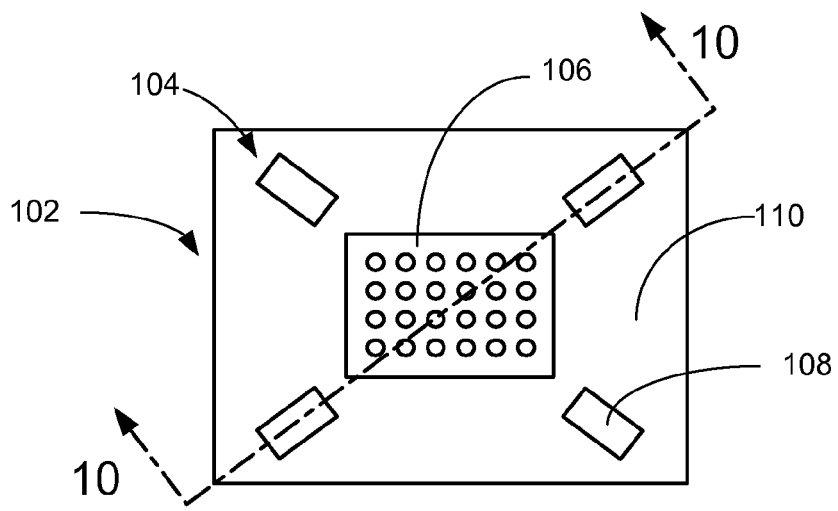
FIG. 9 is a top view of the package topside of the package encapsulation for manufacture of the integrated circuit packaging system of FIG. 1 after a mode phase of manufacture.

Referring now to FIG. 9, therein is shown a top view of the package topside 110 of the package encapsulation 102 for manufacture of the integrated circuit packaging system 100 of FIG. 1 after a mode phase of manufacture. Furthermore, the top side of the top substrate 106 and the top planar portion 108 of the inner heat shield 104 can be exposed after forming the package encapsulation 102. More specifically, the top planar portion 108 of the inner heat shield 104 coplanar to the package topside 110 of the package encapsulation 102 can be exposed.

Figure 10:
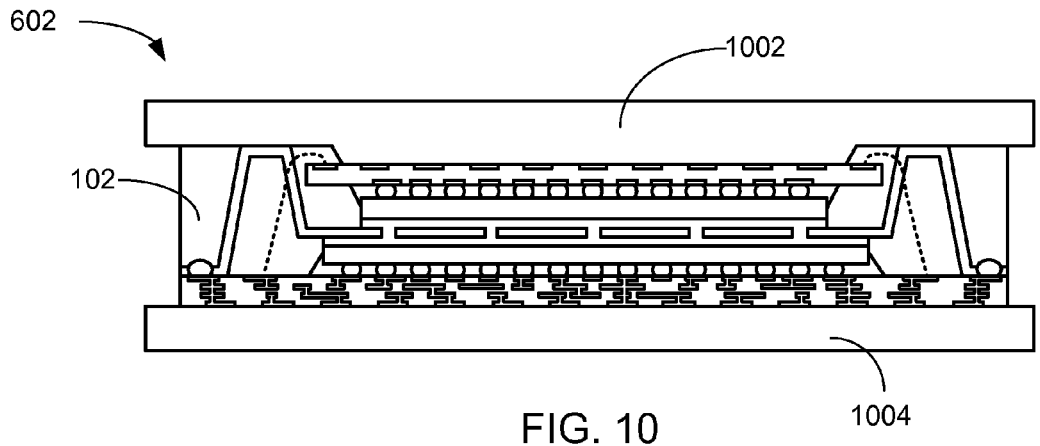
FIG. 10 is a cross-sectional view of the structure along the line 10-10 of FIG. 9 for manufacture of the integrated circuit packaging system of FIG. 1 after mode phase of the manufacture.

Referring now to FIG. 10, therein is shown a cross-sectional view of the structure 602 along the line 10-10 of FIG. 9 for manufacture of the integrated circuit packaging system 100 of FIG. 1 after mode phase of the manufacture. A top chase 1002 and a bottom chase 1004 can form the package encapsulation 102. More specifically, the top chase 1002 can form the package encapsulation 102 with the topside of the top substrate 106 of FIG. 1 exposed.

Figure 11:
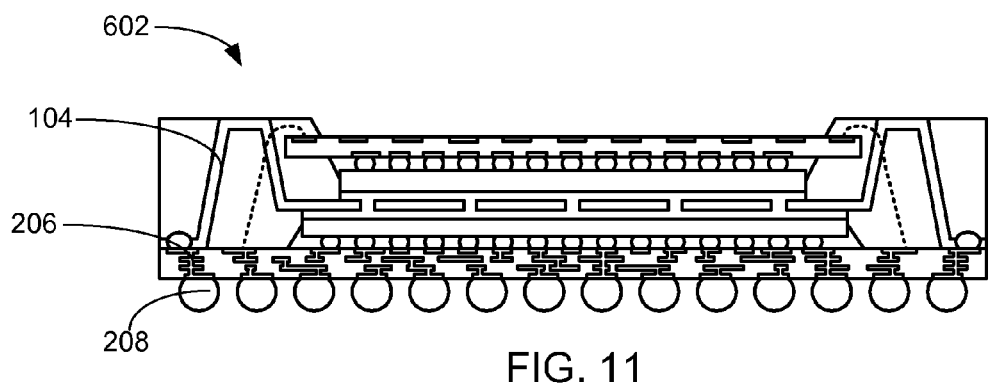
FIG. 11 is a cross-sectional view of the structure along the line 10-10 of FIG. 9 for manufacture of the integrated circuit packaging system of FIG. 1 after connection phase of the manufacture.

Referring now to FIG. 11, therein is shown a cross-sectional view of the structure 602 along the line 10-10 of FIG. 9 for manufacture of the integrated circuit packaging system 100 of FIG. 1 after connection phase of the manufacture. The inner heat shield 104 can thermally connect to the peripheral thermal interconnect 208 through the peripheral thermal via 206.

Figure 12:
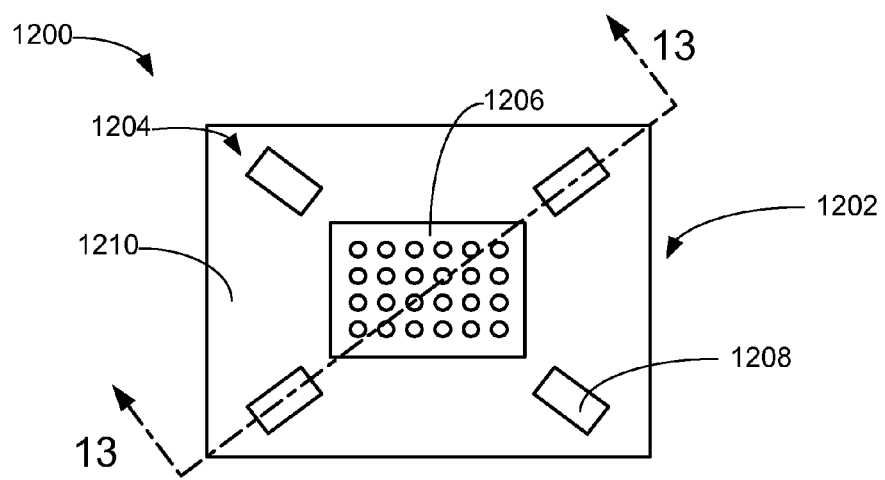
FIG. 12 is a top view of an integrated circuit packaging system in a second embodiment of the present invention.

Referring now to FIG. 12, therein is shown a top view of an integrated circuit packaging system 1200 in a second embodiment of the present invention. The integrated circuit packaging system 1200 can include a package encapsulation 1202. The package encapsulation 1202 is defined as a cover surrounding and protecting the contents in the integrated circuit packaging system 1200 from the environment and hermetically seals the contents internal to the integrated circuit packaging system 1200. The package encapsulation 1202 can be an epoxy molding, protective molding, or encasement structure.

The integrated circuit packaging system 1200 can include an inner heat shield 1204, which is defined as a conductive structure that transfers heat generated within the integrated circuit packaging system 1200 to the external environment. The term "external" refers to outside the integrated circuit packaging system 1200. For example, the inner heat shield 1204 can be a heat spreader or an EMI shield.

A top planar portion 1208 of the inner heat shield 1204 can be exposed from a package topside 1210 of the package encapsulation 1202. For example, a topside of the top planar portion 1208 can be exposed only at the corners of the package topside 1210 of the package encapsulation 1202. The top planar portion 1208 can be evenly spaced at the corners of the package topside 1210 of the package encapsulation 1202.

The integrated circuit packaging system 1200 can include a top substrate 1206, which is defined as a mounting structure for an integrated circuit or other electrical components as well as providing electrical connections between, to, and from the integrated circuit packaging system 1200. For example, the top substrate 1206 can be exposed from the center of the package topside 1210 of the package encapsulation 1202.

It has been discovered that the exposure of the topside of the top planar portion 1208 at the corners of the package topside 1210 allows the evenly spaced dissipation of heat from the center or interior of the integrated circuit packaging system 1200 to the external environment. The exposure of the top planar portion 1208 only at the corners of the package topside 1210 leaves maximum mounting surface on top of the package encapsulation 1202.

Figure 13:
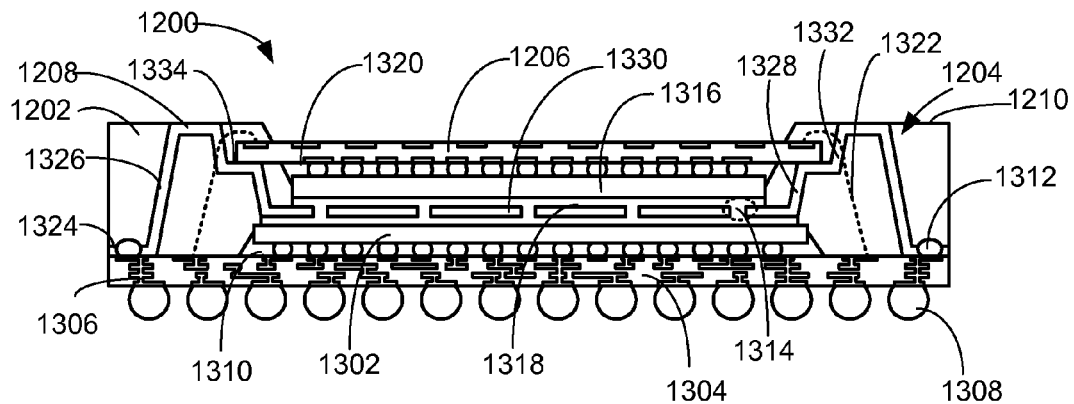
FIG. 13 is a cross-sectional view of the integrated circuit packaging system along the line 13-13 of FIG. 12.

Referring now to FIG. 13, therein is shown a cross-sectional view of the integrated circuit packaging system 1200 along the line 13-13 of FIG. 12. The integrated circuit packaging system 1200 can in include a bottom integrated circuit 1302 on a bottom substrate 1304 having a peripheral thermal via 1306 connected to a peripheral thermal interconnect 1308.

The bottom substrate 1304 is defined as a mounting structure for an integrated circuit or other electrical components as well as providing electrical connections between, to, and from the devices mounted thereto. For example, the bottom integrated circuit 1302 can be mounted over the topside of the bottom substrate 1304.

The bottom integrated circuit 1302 is defined as chip with active circuitry fabricated thereon. For example, the bottom integrated circuit 1302 can include a flip chip, a wire bonded chip, or a packaged integrated circuit. For further example, the bottom integrated circuit 1302 can be mounted over the bottom substrate 1304 with a bottom underfill 1310, which is defined as a structure that provides adhesion and rigidity for mounting an integrated circuit or electrical component on other integrated circuit or electrical component. For example, the bottom underfill 1310 can include a liquid epoxy mixture that provides rigidity and adhesion.

The peripheral thermal via 1306 is defined as a hole filled with electrically conductive material that provides a thermal path, a conductive path, or a combination thereof. For example, the peripheral thermal via 1306 can support the ground connection for the inner heat shield 1204. The peripheral thermal interconnect 1308 is defined as a connection interface for thermal connection to other external components. For example, the peripheral thermal interconnect 1308 can include solder columns, solder balls, or conductive interconnects.

The integrated circuit packaging system 1200 can include a peripheral conductive adhesive 1312, which is defined as a thermally conductive material for holding components in place. For example, the peripheral conductive adhesive 1312 can include gel, thermally conductive epoxy, or thermally conductive polymer. For further example, the peripheral conductive adhesive 1312 can attach the inner heat shield 1204 to the topside of the bottom substrate 1304. For specific example, the peripheral conductive adhesive 1312 can attach the inner heat shield 1204 to the peripheral thermal via 1306 within the bottom substrate 1304.

The integrated circuit packaging system 1200 can include the inner heat shield 1204 over the bottom integrated circuit 1302 with the inner heat shield 1204 connected to the peripheral thermal via 1306. For example, the inner heat shield 1204 can represent a solid plate or can include a plate hole 1314.

The plate hole 1314 is defined as an opening on the inner heat shield 1204. For example, the inner heat shield 1204 can include multiple numbers of openings for the plate hole 1314. For further example, the plate hole 1314 can come in shapes of circle, triangle, square, or a combination thereof. For a specific example, the inner heat shield 1204 can have the plate hole 1314 with the inner heat shield 1204 between the bottom integrated circuit 1302 and a top integrated circuit 1316. More specifically, the inner heat shield 1204 having the plate hole 1314 can dissipate heat and can stabilize and lock an inner thermal adhesive 1318 applied over the inner heat shield 1204 between the bottom integrated circuit 1302 and the top integrated circuit 1316.

The inner heat shield 1204 can include a foot 1324. The peripheral conductive adhesive 1312 can connect the foot 1324 to the peripheral thermal via 1306. The inner heat shield 1204 can include a peripheral leg 1326 extending from the foot 1324. The top planar portion 1208 of the inner heat shield 1204 can extend from the peripheral leg 1326 with the topside of the top planar portion 1208 exposed. For another example, the top planar portion 1208 can be parallel with the topside of the bottom substrate 1304.

A top inner support leg 1332 can extend from the top planar portion 1208 of the inner heat shield 1204. The peripheral leg 1326 and the top inner support leg 1332 can connect to the top planar portion 1208 in an obtuse angle with the obtuse angle facing towards the bottom substrate 1304. For example, the top inner support leg 1332 can be less than half of the length of the peripheral leg 1326.

A horizontal step 1334 can extend from the top inner support leg 1332. The horizontal step 1334 is defined as a portion of the inner heat shield 1204 where the top substrate 1206 can be placed. For example, the topside of the horizontal step 1334 can be coplanar with the bottom side of the top substrate 1206.

A bottom inner support leg 1328 can extend from the horizontal step 1334. For example, the bottom inner support leg 1328 can extend from the horizontal step 1334 in an obtuse angle with the obtuse angle facing towards the bottom substrate 1304. For example, the bottom inner support leg 1328 can be less than half of the length of the peripheral leg 1326.

A central planar portion 1330 of the inner heat shield 1204 can extend from the bottom inner support leg 1328. The central planar portion 1330 can extend over the bottom integrated circuit 1302 to connect to the bottom inner support leg 1328 on the opposite end of the inner heat shield 1204.

It has been discovered that placing the inner heat shield 1204 on the bottom substrate 1304 provides better manufacturability of the integrated circuit packaging system 1200. By focusing the placement of the inner heat shield 1204 on the bottom substrate 1304, the production speed increases, thus, lowering the production cost.

It has been also discovered that the horizontal step 1334 formed from the inner heat shield 1204 can maintain consistent bond line thickness control. As a result, the formation of the horizontal step 1334 can mitigate mold flash risk for improving performance of the integrated circuit packaging system 1200.

The integrated circuit packaging system 1200 can include the inner thermal adhesive 1318, which is defined as a single structure that is thermally conductive material for holding components in place. For example, the inner thermal adhesive 1318 can include gel, thermally conductive epoxy, or thermally conductive polymer. The inner thermal adhesive 1318 can cover a topside and a bottom side of the central planar portion 1330 of the inner heat shield 1204. More specifically, the inner thermal adhesive 1318 can cover the non-active side of the top integrated circuit 1316 and all of the bottom side of the central planar portion 1330.

The integrated circuit packaging system 1200 can include the top integrated circuit 1316 mounted over the top substrate 1206. The top integrated circuit 1316 is defined as chip with active circuitry fabricated thereon. For example, the top integrated circuit 1316 can include a flip chip, a wire bonded chip, or a packaged integrated circuit. Continuing with the example, the active side of the top integrated circuit 1316 and the active side of the bottom integrated circuit 1302 can face away from the inner heat shield 1204.

For further example, the top integrated circuit 1316 can be mounted over the top substrate 1206 with a top underfill 1320, which is defined as a structure that provides adhesion and rigidity for mounting an integrated circuit or electrical component on other integrated circuit or electrical component. For example, the top underfill 1320 can include a liquid epoxy mixture that provides rigidity and adhesion.

It has been discovered that having the inner heat shield 1204, between the bottom integrated circuit 1302 and the top integrated circuit 1316, connected to the peripheral thermal via 1306 improves the thermal performance of the integrated circuit packaging system 1200. Having the inner heat shield 1204 embedded between the bottom integrated circuit 1302 and the top integrated circuit 1316 improves efficiency for heat dissipation for both integrated circuits.

It has been also discovered that the inner heat shield 1204 can provide electromagnetic isolation between the bottom integrated circuit 1302 and the top integrated circuit 1316 to avoid electromagnetic interference between the two integrated circuits. The peripheral thermal via 1306 is connected to the peripheral thermal interconnect 1308, which provides further dissipation of heat from the integrated circuit packaging system 1200. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 1200 can include an electrical interconnect 1322, which is defined as a connection interface for electrical connection to other components. For example, the electrical interconnect 1322 can include a bondwire, solder columns, solder balls, or conductive interconnects. For this example, the electrical interconnect 1322 can represent a bondwire for z-interconnect between the top substrate 1206 and the bottom substrate 1304. For illustrative purposes, the electrical interconnect 1322 is drawn as a dotted line to show that the cross-sectional view can show more than one of the electrical interconnect 1322.

The package encapsulation 1202 can be formed over the bottom integrated circuit 1302, the inner heat shield 1204, and the top integrated circuit 1316 with the top planar portion 1208 of the inner heat shield 1204 coplanar with the package topside 1210 of the package encapsulation 1202. For example, the package encapsulation 1202 can be formed with the topside of the top substrate 1206 exposed.

It has been discovered the connection between the inner heat shield 1204 and the peripheral thermal via 1306 and the top planar portion 1208 being exposed at the package topside 1210 of the package encapsulation 1202 allows the evenly spaced dissipation of heat from the center or interior of the integrated circuit packaging system 1200 to the external environment. This evenly spaced and maximum separation allow maximum thermal conduction path away from the heat generating integrated circuits to the external environment.

Figure 14:
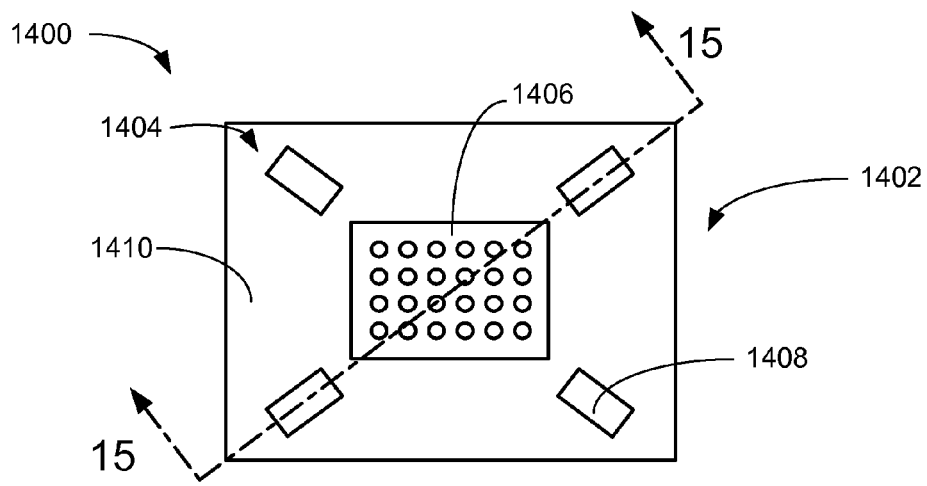
FIG. 14 is a top view of an integrated circuit packaging system in a third embodiment of the present invention.

Referring now to FIG. 14, therein is shown a top view of an integrated circuit packaging system 1400 in a third embodiment of the present invention. The integrated circuit packaging system 1400 can include a package encapsulation 1402. The package encapsulation 1402 is defined as a cover surrounding and protecting the contents in the integrated circuit packaging system 1400 from the environment and hermetically seals the contents internal to the integrated circuit packaging system 1400. The package encapsulation 1402 can be an epoxy molding, protective molding, or encasement structure.

The integrated circuit packaging system 1400 can include an inner heat shield 1404, which is defined as a conductive structure that transfers heat generated within the integrated circuit packaging system 1400 to the external environment. The term "external" refers to outside the integrated circuit packaging system 1400. For example, the inner heat shield 1404 can be a heat spreader or an EMI shield.

A top planar portion 1408 of the inner heat shield 1404 can be exposed from a package topside 1410 of the package encapsulation 1402. For example, a topside of the top planar portion 1408 can be exposed only at the corners of the package topside 1410 of the package encapsulation 1402. The top planar portion 1408 can be evenly spaced at the corners of the package topside 1410 of the package encapsulation 1402.

The integrated circuit packaging system 1400 can include a top substrate 1406, which is defined as a mounting structure for an integrated circuit or other electrical components as well as providing electrical connections between, to, and from the integrated circuit packaging system 1400. For example, the top substrate 1406 can be exposed from the center of the package topside 1410 of the package encapsulation 1402.

It has been discovered that the exposure of the topside of the top planar portion 1408 at the corners of the package topside 1410 allows the evenly spaced dissipation of heat from the center or interior of the integrated circuit packaging system 1400 to the external environment. The exposure of the top planar portion 1408 only at the corners of the package topside 1410 leaves maximum mounting surface on top of the package encapsulation 1402.

Figure 15:
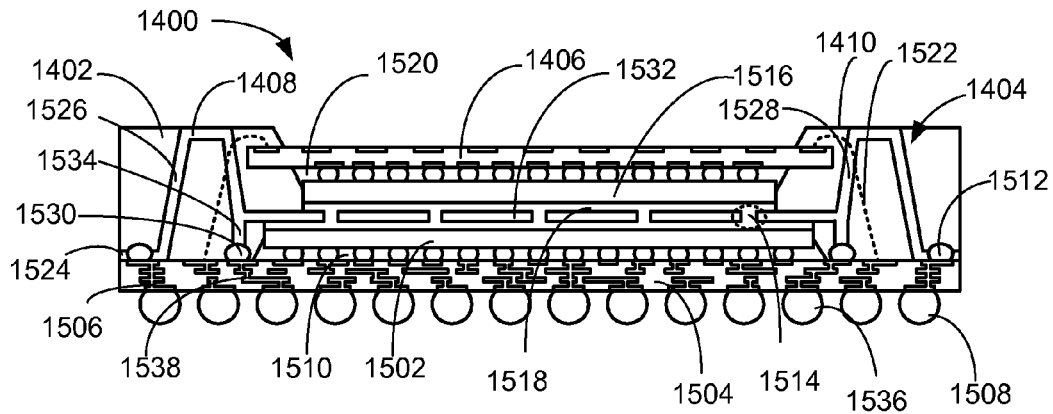
FIG. 15 is a cross-sectional view of the integrated circuit packaging system along the line 15-15 of FIG. 14.

Referring now to FIG. 15, therein is shown a cross-sectional view of the integrated circuit packaging system 1400 along the line 15-15 of FIG. 14. The integrated circuit packaging system 1400 can in include a bottom integrated circuit 1502 on a bottom substrate 1504 having a peripheral thermal via 1506 connected to a peripheral thermal interconnect 1508.

The bottom substrate 1504 is defined as a mounting structure for an integrated circuit or other electrical components as well as providing electrical connections between, to, and from the devices mounted thereto. For example, the bottom integrated circuit 1502 can be mounted over the topside of the bottom substrate 1504.

The bottom integrated circuit 1502 is defined as chip with active circuitry fabricated thereon. For example, the bottom integrated circuit 1502 can include a flip chip, a wire bonded chip, or a packaged integrated circuit. For further example, the bottom integrated circuit 1502 can be mounted over the bottom substrate 1504 with a bottom underfill 1510, which is defined as a structure that provides adhesion and rigidity for mounting an integrated circuit or electrical component on other integrated circuit or electrical component. For example, the bottom underfill 1510 can include a liquid epoxy mixture that provides rigidity and adhesion.

The peripheral thermal via 1506 is defined as a hole filled with electrically conductive material that provides a thermal path, a conductive path, or a combination thereof. For example, the peripheral thermal via 1506 can support the ground connection for the inner heat shield 1404. The peripheral thermal interconnect 1508 is defined as a connection interface for thermal connection to other components. For example, the peripheral thermal interconnect 1508 can include solder columns, solder balls, or conductive interconnects.

The integrated circuit packaging system 1400 can include a peripheral conductive adhesive 1512, which is defined as a thermally conductive material for holding components in place. For example, the peripheral conductive adhesive 1512 can include gel, thermally conductive epoxy, or thermally conductive polymer. For further example, the peripheral conductive adhesive 1512 can attach the inner heat shield 1404 to the topside of the bottom substrate 1504. For specific example, the peripheral conductive adhesive 1512 can attach the inner heat shield 1404 to the peripheral thermal via 1506 within the bottom substrate 1504.

The integrated circuit packaging system 1400 can include the inner heat shield 1404 over the bottom integrated circuit 1502 with the inner heat shield 1404 connected to the peripheral thermal via 1506. For example, the inner heat shield 1404 can represent a solid plate or can include a plate hole 1514.

The plate hole 1514 is defined as an opening on the inner heat shield 1404. For example, the inner heat shield 1404 can include multiple numbers of openings for the plate hole 1514. For further example, the plate hole 1514 can come in shapes of circle, triangle, square, or a combination thereof. For a specific example, the inner heat shield 1404 can have the plate hole 1514 with the inner heat shield 1404 between the bottom integrated circuit 1502 and a top integrated circuit 1516. More specifically, the inner heat shield 1404 having the plate hole 1514 can dissipate heat and can stabilize and lock an inner thermal adhesive 1518 applied over the inner heat shield 1404 between the bottom integrated circuit 1502 and the top integrated circuit 1516.

The inner heat shield 1404 can include a foot 1524. The peripheral conductive adhesive 1512 can connect the foot 1524 to the peripheral thermal via 1506. The inner heat shield 1404 can include a peripheral leg 1526 extending from the foot 1524. The top planar portion 1408 of the inner heat shield 1404 can extend from the peripheral leg 1526 with the topside of the top planar portion 1408 exposed. For another example, the top planar portion 1408 can be parallel with the topside of the bottom substrate 1504.

An inner support leg 1528 can extend from the top planar portion 1408 of the inner heat shield 1404. The peripheral leg 1526 and the inner support leg 1528 can connect to the top planar portion 1408 in an obtuse angle with the obtuse angle facing towards the bottom substrate 1504. For example, the inner support leg 1528 can be greater than half of the length of the peripheral leg 1526.

An inner grounding leg 1534 can extend from the inner support leg 1528 of the inner heat shield 1404. For example, the inner grounding leg 1534 can be less than half of the length of the peripheral leg 1526 or the inner support leg 1528.

The inner grounding leg 1534 can connect to an inner thermal interconnect 1536 through an inner thermal via 1538. The inner thermal via 1538 is defined as a hole filled with electrically conductive material that provides a thermal path, a conductive path, or a combination thereof. The inner thermal interconnect 1536 is defined as a connection interface for thermal connection to other components. For example, the peripheral thermal interconnect 1508 can connect to the inner thermal interconnect 1536 through the peripheral thermal via 1506, the inner heat shield 1404, the inner grounding leg 1534, and the inner thermal via 1538. For different example, the inner grounding leg 1534 can include an EMI shield.

For another example, an inner conductive adhesive 1530 can attach the inner grounding leg 1534 to the topside of the bottom substrate 1504. The inner conductive adhesive 1530 is defined as a thermally conductive material for holding components in place.

A central planar portion 1532 of the inner heat shield 1404 can extend from the inner support leg 1528 and the inner grounding leg 1534. The central planar portion 1532 can extend over the bottom integrated circuit 1502 to connect to the inner support leg 1528 and the inner grounding leg 1534 on the opposite end of the inner heat shield 1404.

It has been discovered that placing the inner heat shield 1404 on the bottom substrate 1504 provides better manufacturability of the integrated circuit packaging system 1400. By focusing the placement of the inner heat shield 1404 on the bottom substrate 1504, the production speed increases, thus, lowering the production cost.

The integrated circuit packaging system 1400 can include the inner thermal adhesive 1518, which is defined as a single structure that is thermally conductive material for holding components in place. For example, the inner thermal adhesive 1518 can include gel, thermally conductive epoxy, or thermally conductive polymer. The inner thermal adhesive 1518 can cover a topside and a bottom side of the central planar portion 1532 of the inner heat shield 1404. More specifically, the inner thermal adhesive 1518 can cover the non-active side of the bottom integrated circuit 1502 and the top integrated circuit 1516.

The integrated circuit packaging system 1400 can include the top integrated circuit 1516 mounted over the top substrate 1406. The top integrated circuit 1516 is defined as chip with active circuitry fabricated thereon. For example, the top integrated circuit 1516 can include a flip chip, a wire bonded chip, or a packaged integrated circuit. Continuing with the example, the active side of the top integrated circuit 1516 and the active side of the bottom integrated circuit 1502 can face away from the inner heat shield 1404.

For further example, the top integrated circuit 1516 can be mounted over the top substrate 1406 with a top underfill 1520, which is defined as a structure that provides adhesion and rigidity for mounting an integrated circuit or electrical component on other integrated circuit or electrical component. For example, the top underfill 1520 can include a liquid epoxy mixture that provides rigidity and adhesion.

It has been discovered that having the inner heat shield 1404, between the bottom integrated circuit 1502 and the top integrated circuit 1516, connected to the peripheral thermal via 1506 improves the thermal performance of the integrated circuit packaging system 1400. Having the inner heat shield 1404 embedded between the bottom integrated circuit 1502 and the top integrated circuit 1516 improves efficiency for heat dissipation for both integrated circuits.

It has been also discovered that the inner heat shield 1404 can provide electromagnetic isolation between the bottom integrated circuit 1502 and the top integrated circuit 1516 to avoid electromagnetic interference between the two integrated circuits. The peripheral thermal via 1506 is connected to the peripheral thermal interconnect 1508, which provides further dissipation of heat from the integrated circuit packaging system 1400. Improving the thermal performance of the integrated circuits increases board level reliability and performance of the semiconductor device. The thermally-enhanced package design of the present invention can be applied to various semiconductor devices, thus, lowering the production cost.

It has been further discovered that the placement of the inner grounding leg 1534 can create individual electromagnetic isolation to avoid electromagnetic interference between the bottom integrated circuit 1502 and the top integrated circuit 1516. Furthermore, the dissipation of heat can be greatly improved by attaching the inner grounding leg 1534 to the inner thermal interconnect 1536 through the inner thermal via 1538. As a result, the thermal performance of the integrated circuits improves the board level reliability for performance improvement of the semiconductor device.

The integrated circuit packaging system 1400 can include an electrical interconnect 1522, which is defined as a connection interface for electrical connection to other components. For example, the electrical interconnect 1522 can include a bondwire, solder columns, solder balls, or conductive interconnects. For this example, the electrical interconnect 1522 can represent a bondwire for z-interconnect between the top substrate 1406 and the bottom substrate 1504. For illustrative purposes, the electrical interconnect 1522 is drawn as a dotted line to show that the cross-sectional view can show more than one of the electrical interconnect 1522.

The package encapsulation 1402 can be formed over the bottom integrated circuit 1502, the inner heat shield 1404, and the top integrated circuit 1516 with the top planar portion 1408 of the inner heat shield 1404 coplanar with the package topside 1410 of the package encapsulation 1402. For example, the package encapsulation 1402 can be formed with the topside of the top substrate 1406 exposed.

It has been discovered the connection between the inner heat shield 1404 and the peripheral thermal via 1506 and the top planar portion 1408 being exposed at the package topside 1410 of the package encapsulation 1402 allows the evenly spaced dissipation of heat from the center or interior of the integrated circuit packaging system 1400 to the external environment. This evenly spaced and maximum separation allow maximum thermal conduction path away from the heat generating integrated circuits to the external environment.

Figure 16:
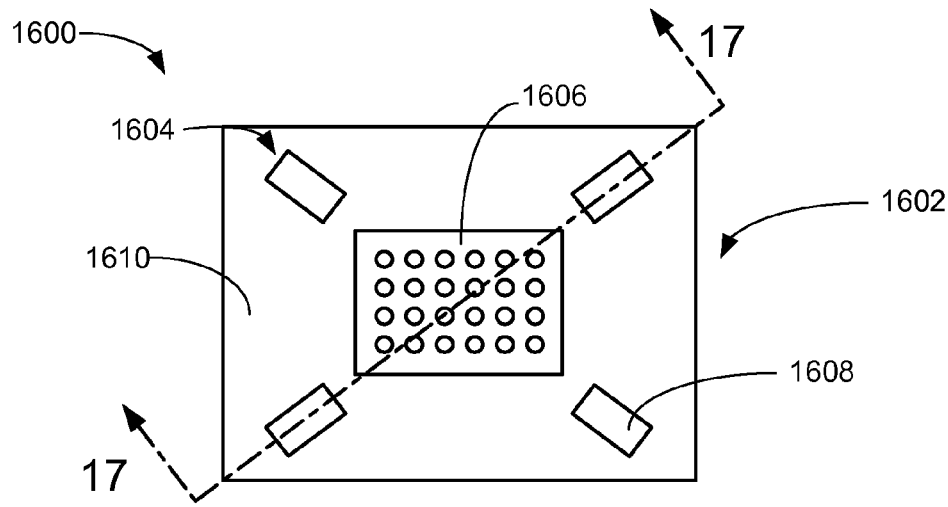
FIG. 16 is a top view of an integrated circuit packaging system in a fourth embodiment of the present invention.

Referring now to FIG. 16, therein is shown a top view of an integrated circuit packaging system 1600 in a fourth embodiment of the present invention. The integrated circuit packaging system 1600 can include a package encapsulation 1602. The package encapsulation 1602 is defined as a cover surrounding and protecting the contents in the integrated circuit packaging system 1600 from the environment and hermetically seals the contents internal to the integrated circuit packaging system. The package encapsulation 1602 can be an epoxy molding, protective molding, or encasement structure.

The integrated circuit packaging system 1600 can include an inner heat shield 1604, which is defined as a conductive structure that transfers heat generated within the integrated circuit packaging system 1600 to the external environment. The term "external" refers to outside the integrated circuit packaging system 1600. For example, the inner heat shield 1604 can be a heat spreader or an EMI shield.

A top planar portion 1608 of the inner heat shield 1604 can be exposed from a package topside 1610 of the package encapsulation 1602. For example, a topside of the top planar portion 1608 can be exposed only at the corners of the package topside 1610 of the package encapsulation 1602. The top planar portion 1608 can be evenly spaced at the corners of the package topside 1610 of the package encapsulation 1602.

The integrated circuit packaging system 1600 can include a top substrate 1606, which is defined as a mounting structure for an integrated circuit or other electrical components as well as providing electrical connections between, to, and from the integrated circuit packaging system 1600. For example, the top substrate 1606 can be exposed from the center of the package topside 1610 of the package encapsulation 1602.

It has been discovered that the exposure of the topside of the top planar portion 1608 at the corners of the package topside 1610 allows the evenly spaced dissipation of heat from the center or interior of the integrated circuit packaging system 1600 to the external environment. The exposure of the top planar portion 1608 only at the corners of the package topside 1610 leaves maximum mounting surface on top of the package encapsulation 1602.

Figure 17:
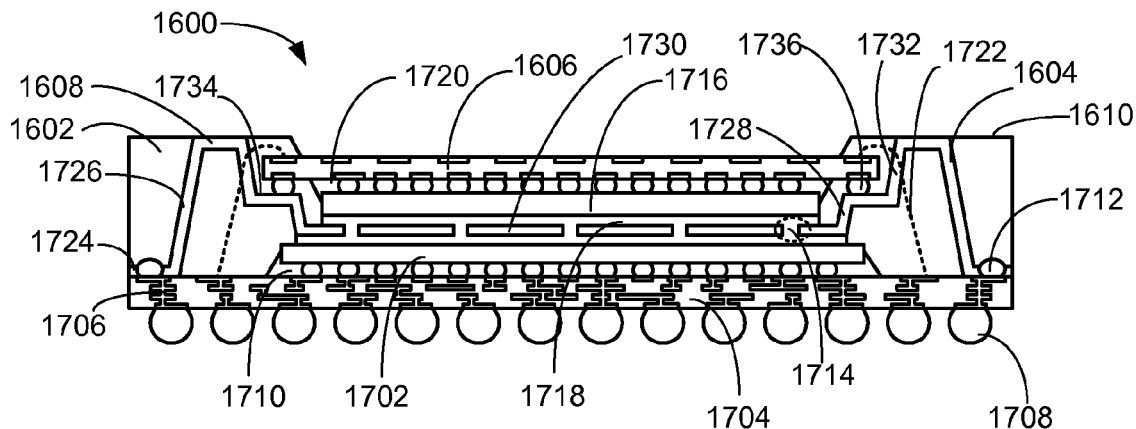
FIG. 17 is a cross-sectional view of the integrated circuit packaging system along the line 17-17 of FIG. 16.

Referring now to FIG. 17, therein is shown a cross-sectional view of the integrated circuit packaging system 1600 along the line 17-17 of FIG. 16. The integrated circuit packaging system 1600 can in include a bottom integrated circuit 1702 on a bottom substrate 1704 having a peripheral thermal via 1706 connected to a peripheral thermal interconnect 1708.

The bottom substrate 1704 is defined as a mounting structure for an integrated circuit or other electrical components as well as providing electrical connections between, to, and from the devices mounted thereto. For example, the bottom integrated circuit 1702 can be mounted over the topside of the bottom substrate 1704.

The bottom integrated circuit 1702 is defined as chip with active circuitry fabricated thereon. For example, the bottom integrated circuit 1702 can include a flip chip, a wire bonded chip, or a packaged integrated circuit. For further example, the bottom integrated circuit 1702 can be mounted over the bottom substrate 1704 with a bottom underfill 1710, which is defined as a structure that provides adhesion and rigidity for mounting an integrated circuit or electrical component on other integrated circuit or electrical component. For example, the bottom underfill 1710 can include a liquid epoxy mixture that provides rigidity and adhesion.

The peripheral thermal via 1706 is defined as a hole filled with electrically conductive material that provides a thermal path, a conductive path, or a combination thereof. For example, the peripheral thermal via 1706 can support the ground connection for the inner heat shield 1604. The peripheral thermal interconnect 1708 is defined as a connection interface for thermal connection to other components. For example, the peripheral thermal interconnect 1708 can include solder columns, solder balls, or conductive interconnects.

The integrated circuit packaging system 1600 can include a peripheral conductive adhesive 1712, which is defined as a thermally conductive material for holding components in place. For example, the peripheral conductive adhesive 1712 can include gel, thermally conductive epoxy, or thermally conductive polymer. For further example, the peripheral conductive adhesive 1712 can attach the inner heat shield 1604 to the topside of the bottom substrate 1704. For specific example, the peripheral conductive adhesive 1712 can attach the inner heat shield 1604 to the peripheral thermal via 1706 within the bottom substrate 1704.

The integrated circuit packaging system 1600 can include the inner heat shield 1604 over the bottom integrated circuit 1702 with the inner heat shield 1604 connected to the peripheral thermal via 1706. For example, the inner heat shield 1604 can represent a solid plate or can include a plate hole 1714.

The plate hole 1714 is defined as an opening on the inner heat shield 1604. For example, the inner heat shield 1604 can include multiple numbers of openings for the plate hole 1714. For further example, the plate hole 1714 can come in shapes of circle, triangle, square, or a combination thereof. For a specific example, the inner heat shield 1604 can have the plate hole 1714 with the inner heat shield 1604 between the bottom integrated circuit 1702 and a top integrated circuit 1716. More specifically, the inner heat shield 1604 having the plate hole 1714 can dissipate heat and can stabilize and lock an inner thermal adhesive 1718 applied over the inner heat shield 1604 between the bottom integrated circuit 1702 and the top integrated circuit 1716.

The inner heat shield 1604 can include a foot 1724. The peripheral conductive adhesive 1712 can connect the foot 1724 to the peripheral thermal via 1706. The inner heat shield 1604 can include a peripheral leg 1726 extending from the foot 1724. The top planar portion 1608 of the inner heat shield 1604 can extend from the peripheral leg 1726 with the topside of the top planar portion 1608 exposed. For another example, the top planar portion 1608 can be parallel with the topside of the bottom substrate 1704.

A top inner support leg 1732 can extend from the top planar portion 1608 of the inner heat shield 1604. The peripheral leg 1726 and the top inner support leg 1732 can connect to the top planar portion 1608 in an obtuse angle with the obtuse angle facing towards the bottom substrate 1704. For example, the top inner support leg 1732 can be less than half of the length of the peripheral leg 1726.

A horizontal step 1734 can extend from the top inner support leg 1732. The horizontal step 1734 is defined as a portion of the inner heat shield 1604 where the top substrate 1606 can receive support by being placed on a top thermal interconnect 1736. The top thermal interconnect 1736 is defined as a connection interface for thermal connection to other components. For example, the topside of the horizontal step 1734 can be coplanar with the active side of the top integrated circuit 1716. For further example, the top substrate 1606 can connect to the horizontal step 1734 of the inner heat shield 1604 through the top thermal interconnect 1736.

A bottom inner support leg 1728 can extend from the horizontal step 1734. For example, the bottom inner support leg 1728 can extend from the horizontal step 1734 in an obtuse angle with the obtuse angle facing towards the bottom substrate 1704. For example, the bottom inner support leg 1728 can be less than half of the length of the peripheral leg 1726.

A central planar portion 1730 of the inner heat shield 1604 can extend from the bottom inner support leg 1728. The central planar portion 1730 can extend over the bottom integrated circuit 1702 to connect to the bottom inner support leg 1728 on the opposite end of the inner heat shield 1604.

It has been discovered that placing the inner heat shield 1604 on the bottom substrate 1704 provides better manufacturability of the integrated circuit packaging system 1600. By focusing the placement of the inner heat shield 1604 on the bottom substrate 1704, the production speed increases, thus, lowering the production cost.

The integrated circuit packaging system 1600 can include the inner thermal adhesive 1718, which is defined as a single structure that is thermally conductive material for holding components in place. For example, the inner thermal adhesive 1718 can include gel, thermally conductive epoxy, or thermally conductive polymer. The inner thermal adhesive 1718 can cover a topside and a bottom side of the central planar portion 1730 of the inner heat shield 1604. More specifically, the inner thermal adhesive 1718 can cover the non-active side of the top integrated circuit 1716 and all of the bottom side of the central planar portion 1730.

The integrated circuit packaging system 1600 can include the top integrated circuit 1716 mounted over the top substrate 1606. The top integrated circuit 1716 is defined as chip with active circuitry fabricated thereon. For example, the top integrated circuit 1716 can include a flip chip, a wire bonded chip, or a packaged integrated circuit. Continuing with the example, the active side of the top integrated circuit 1716 and the active side of the bottom integrated circuit 1702 can face away from the inner heat shield 1604.

For further example, the top integrated circuit 1716 can be mounted over the top substrate 1606 with a top underfill 1720, which is defined as a structure that provides adhesion and rigidity for mounting an integrated circuit or electrical component on other integrated circuit or electrical component. For example, the top underfill 1720 can include a liquid epoxy mixture that provides rigidity and adhesion.

It has been discovered that having the inner heat shield 1604, between the bottom integrated circuit 1702 and the top integrated circuit 1716, connected to the peripheral thermal via 1706 improves the thermal performance of the integrated circuit packaging system 1600. Having the inner heat shield 1604 embedded between the bottom integrated circuit 1702 and the top integrated circuit 1716 improves efficiency for heat dissipation for both integrated circuits.

It has been also discovered that the inner heat shield 1604 can provide electromagnetic isolation between the bottom integrated circuit 1702 and the top integrated circuit 1716 to avoid electromagnetic interference between the two integrated circuits. The peripheral thermal via 1706 is connected to the peripheral thermal interconnect 1708, which provides further dissipation of heat from the integrated circuit packaging system 1600. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 1600 can include an electrical interconnect 1722, which is defined as a connection interface for electrical connection to other components. For example, the electrical interconnect 1722 can include a bondwire, solder columns, solder balls, or conductive interconnects. For this example, the electrical interconnect 1722 can represent a bondwire for z-interconnect between the top substrate 1606 and the bottom substrate 1704. For illustrative purposes, the electrical interconnect 1722 is drawn as a dotted line to show that the cross-sectional view can show more than one of the electrical interconnect 1722.

It has further been discovered that placing the top substrate 1606 on the horizontal step 1734 of the inner heat shield 1604 through the top thermal interconnect 1736 can reduce grounding by the electrical interconnect 1722. As a result, the top integrated circuit 1716 can ground through the top thermal interconnect 1736, thus, enhancing electrical performance by the top integrated circuit 1716.

The package encapsulation 1602 can be formed over the bottom integrated circuit 1702, the inner heat shield 1604, and the top integrated circuit 1716 with the top planar portion 1608 of the inner heat shield 1604 coplanar with the package topside 1610 of the package encapsulation 1602. For example, the package encapsulation 1602 can be formed with the topside of the top substrate 1606 exposed.

It has been discovered the connection between the inner heat shield 1604 and the peripheral thermal via 1706 and the top planar portion 1608 being exposed at the package topside 1610 of the package encapsulation 1602 allows the evenly spaced dissipation of heat from the center or interior of the integrated circuit packaging system 1600 to the external environment. This evenly spaced and maximum separation allow maximum thermal conduction path away from the heat generating integrated circuits to the external environment.

Figure 18:
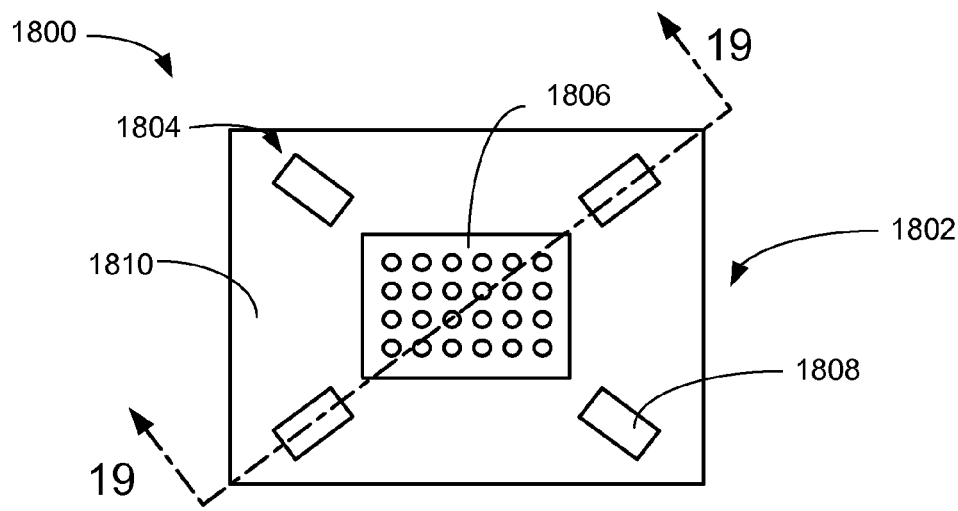
FIG. 18 is a top view of an integrated circuit packaging system in a fifth embodiment of the present invention.

Referring now to FIG. 18, therein is shown a top view of an integrated circuit packaging system 1800 in a fifth embodiment of the present invention. The integrated circuit packaging system 1800 can include a package encapsulation 1802. The package encapsulation 1802 is defined as a cover surrounding and protecting the contents in the integrated circuit packaging system 1800 from the environment and hermetically seals the contents internal to the integrated circuit packaging system. The package encapsulation 1802 can be an epoxy molding, protective molding, or encasement structure.

The integrated circuit packaging system 1800 can include an inner heat shield 1804, which is defined as a conductive structure that transfers heat generated within the integrated circuit packaging system 1800 to the external environment. The term "external" refers to outside the integrated circuit packaging system 1800. For example, the inner heat shield 1804 can be a heat spreader or an electromagnetic interference (EMI) shield.

A top planar portion 1808 of the inner heat shield 1804 can be exposed from a package topside 1810 of the package encapsulation 1802. For example, a topside of the top planar portion 1808 can be exposed only at the corners of the package topside 1810 of the package encapsulation 1802. The top planar portion 1808 can be evenly spaced at the corners of the package topside 1810 of the package encapsulation 1802.

The integrated circuit packaging system 1800 can include a top substrate 1806, which is defined as a mounting structure for an integrated circuit or other electrical components as well as providing electrical connections between, to, and from the integrated circuit packaging system 1800. For example, the top substrate 1806 can be exposed from the center of the package topside 1810 of the package encapsulation 1802.

It has been discovered that the exposure of the topside of the top planar portion 1808 at the corners of the package topside 1810 allows the evenly spaced dissipation of heat from the center or interior of the integrated circuit packaging system 1800 to the external environment. The exposure of the top planar portion 1808 only at the corners of the package topside 1810 leaves maximum mounting surface on top of the package encapsulation 1802.

Figure 19:
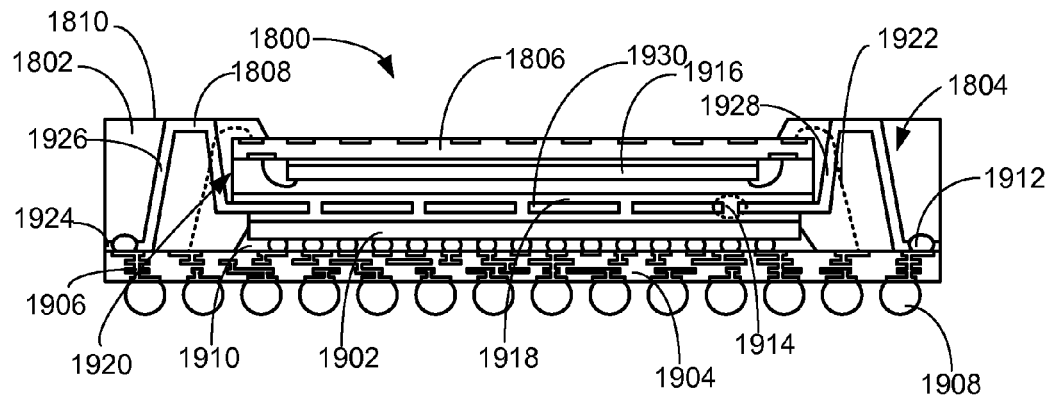
FIG. 19 is a cross-sectional view of the integrated circuit packaging system along the line 19-19 of FIG. 18.

Referring now to FIG. 19, therein is shown a cross-sectional view of the integrated circuit packaging system 1800 along the line 19-19 of FIG. 18. The integrated circuit packaging system 1800 can in include a bottom integrated circuit 1902 on a bottom substrate 1904 having a peripheral thermal via 1906 connected to a peripheral thermal interconnect 1908.

The bottom substrate 1904 is defined as a mounting structure for an integrated circuit or other electrical components as well as providing electrical connections between, to, and from the devices mounted thereto. For example, the bottom integrated circuit 1902 can be mounted over the topside of the bottom substrate 1904.

The bottom integrated circuit 1902 is defined as chip with active circuitry fabricated thereon. For example, the bottom integrated circuit 1902 can include a flip chip, a wire bonded chip, or a packaged integrated circuit. For further example, the bottom integrated circuit 1902 can be mounted over the bottom substrate 1904 with a bottom underfill 1910, which is defined as a structure that provides adhesion and rigidity for mounting an integrated circuit or electrical component on other integrated circuit or electrical component. For example, the bottom underfill 1910 can include a liquid epoxy mixture that provides rigidity and adhesion.

The peripheral thermal via 1906 is defined as a hole filled with electrically conductive material that provides a thermal path, a conductive path, or a combination thereof. For example, the peripheral thermal via 1906 can support the ground connection for the inner heat shield 1804. The peripheral thermal interconnect 1908 is defined as a connection interface for thermal connection to other components. For example, the peripheral thermal interconnect 1908 can include solder columns, solder balls, or conductive interconnects.

The integrated circuit packaging system 1800 can include a peripheral conductive adhesive 1912, which is defined as a thermally conductive material for holding components in place. For example, the peripheral conductive adhesive 1912 can include gel, thermally conductive epoxy, or thermally conductive polymer. For further example, the peripheral conductive adhesive 1912 can attach the inner heat shield 1804 to the topside of the bottom substrate 1904. For specific example, the peripheral conductive adhesive 1912 can attach the inner heat shield 1804 to the peripheral thermal via 1906 within the bottom substrate 1904.

The integrated circuit packaging system 1800 can include the inner heat shield 1804 over the bottom integrated circuit 1902 with the inner heat shield 1804 connected to the peripheral thermal via 1906. For example, the inner heat shield 1804 can represent a solid plate or can include a plate hole 1914.

The plate hole 1914 is defined as an opening on the inner heat shield 1804. For example, the inner heat shield 1804 can include multiple numbers of openings for the plate hole 1914. For further example, the plate hole 1914 can come in shapes of circle, triangle, square, or a combination thereof. For a specific example, the inner heat shield 1804 can have the plate hole 1914 with the inner heat shield 1804 between the bottom integrated circuit 1902 and a top integrated circuit 1916. More specifically, the inner heat shield 1804 having the plate hole 1914 can dissipate heat and can stabilize and lock an inner thermal adhesive 1918 applied over the inner heat shield 1804 between the bottom integrated circuit 1902 and the top integrated circuit 1916.

The inner heat shield 1804 can include a foot 1924. The peripheral conductive adhesive 1912 can connect the foot 1924 to the peripheral thermal via 1906. The inner heat shield 1804 can include a peripheral leg 1926 extending from the foot 1924. The top planar portion 1808 of the inner heat shield 1804 can extend from the peripheral leg 1926 with the topside of the top planar portion 1808 exposed. For another example, the top planar portion 1808 can be parallel with the topside of the bottom substrate 1904.

An inner support leg 1928 can extend from the top planar portion 1808 of the inner heat shield 1804. The peripheral leg 1926 and the inner support leg 1928 can connect to the top planar portion 1808 in an obtuse angle with the obtuse angle facing towards the bottom substrate 1904. For example, the inner support leg 1928 can be greater than half of the length of the peripheral leg 1926.

A central planar portion 1930 of the inner heat shield 1804 can extend from the inner support leg 1928. The central planar portion 1930 can extend over the bottom integrated circuit 1902 to connect to the inner support leg 1928 on the opposite end of the inner heat shield 1804.

It has been discovered that placing the inner heat shield 1804 on the bottom substrate 1904 provides better manufacturability of the integrated circuit packaging system 1800. By focusing the placement of the inner heat shield 1804 on the bottom substrate 1904, the production speed increases, thus, lowering the production cost.

The integrated circuit packaging system 1800 can include the inner thermal adhesive 1918, which is defined as a single structure that is thermally conductive material for holding components in place. For example, the inner thermal adhesive 1918 can include gel, thermally conductive epoxy, or thermally conductive polymer. The inner thermal adhesive 1918 can cover a topside and a bottom side of the central planar portion 1930 of the inner heat shield 1804. More specifically, the inner thermal adhesive 1918 can cover the non-active side of the bottom integrated circuit 1902 and all of the bottom side of an inner package 1920.

The integrated circuit packaging system 1800 can include the top integrated circuit 1916 mounted over the top substrate 1806. The top integrated circuit 1916 is defined as chip with active circuitry fabricated thereon. For example, the top integrated circuit 1916 can include a flip chip, a wire bonded chip, or a packaged integrated circuit.

The integrated circuit packaging system 1800 can include the inner package 1920 having the top integrated circuit 1916. The inner package 1920 is defined as a packaged integrated circuit that can be mounted on other package or structures, or receive other packages. For example, the inner package 1920 can include the top integrated circuit 1916 representing a wire bond chip. For further example, the active side of the top integrated circuit 1916 can face towards the inner heat shield 1804 while the active side of the bottom integrated circuit 1902 can face away from the inner heat shield 1804.

It has been discovered that having the inner heat shield 1804, between the bottom integrated circuit 1902 and the top integrated circuit 1916, connected to the peripheral thermal via 1906 improves the thermal performance of the integrated circuit packaging system 1800. Having the inner heat shield 1804 embedded between the bottom integrated circuit 1902 and the top integrated circuit 1916 improves efficiency for heat dissipation for both integrated circuits.

It has been also discovered that the inner heat shield 1804 can provide electromagnetic isolation between the bottom integrated circuit 1902 and the top integrated circuit 1916 to avoid electromagnetic interference between the two integrated circuits. The peripheral thermal via 1906 is connected to the peripheral thermal interconnect 1908, which provides further dissipation of heat from the integrated circuit packaging system 1800. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 1800 can include an electrical interconnect 1922, which is defined as a connection interface for electrical connection to other components. For example, the electrical interconnect 1922 can include a bondwire, solder columns, solder balls, or conductive interconnects. For this example, the electrical interconnect 1922 can represent a bondwire for z-interconnect between the top substrate 1806 and the bottom substrate 1904. For illustrative purposes, the electrical interconnect 1922 is drawn as a dotted line to show that the cross-sectional view can show more than one of the electrical interconnect 1922.

The package encapsulation 1802 can be formed over the bottom integrated circuit 1902, the inner heat shield 1804, and the top integrated circuit 1916 with the top planar portion 1808 of the inner heat shield 1804 coplanar with the package topside 1810 of the package encapsulation 1802. For example, the package encapsulation 1802 can be formed with the topside of the top substrate 1806 exposed.

It has been discovered the connection between the inner heat shield 1804 and the peripheral thermal via 1906 and the top planar portion 1808 being exposed at the package topside 1810 of the package encapsulation 1802 allows the evenly spaced dissipation of heat from the center or interior of the integrated circuit packaging system 1800 to the external environment. This evenly spaced and maximum separation allow maximum thermal conduction path away from the heat generating integrated circuits to the external environment.

Figure 20:
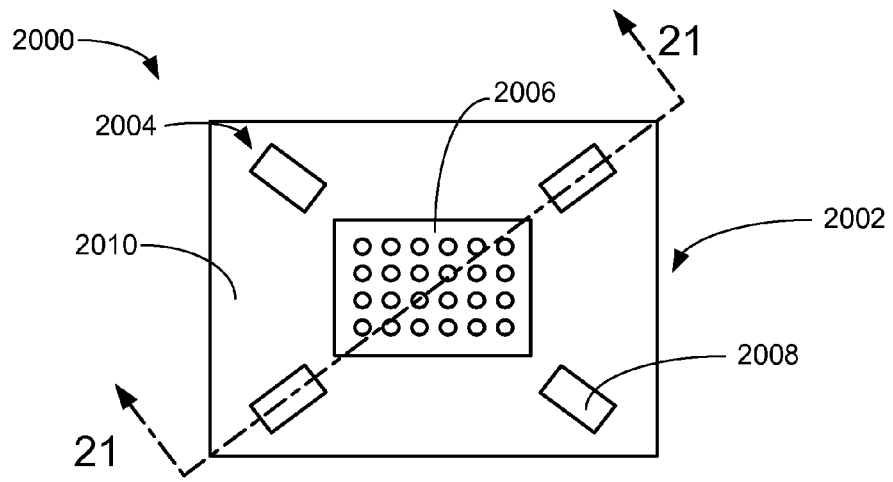
FIG. 20 is a top view of an integrated circuit packaging system in a sixth embodiment of the present invention.

Referring now to FIG. 20, therein is shown a top view of an integrated circuit packaging system 2000 in a sixth embodiment of the present invention. The integrated circuit packaging system 2000 can include a package encapsulation 2002. The package encapsulation 2002 is defined as a cover surrounding and protecting the contents in the integrated circuit packaging system 2000 from the environment and hermetically seals the contents internal to the integrated circuit packaging system. The package encapsulation 2002 can be an epoxy molding, protective molding, or encasement structure.

The integrated circuit packaging system 2000 can include an inner heat shield 2004, which is defined as a conductive structure that transfers heat generated within the integrated circuit packaging system 2000 to the external environment. The term "external" refers to outside the integrated circuit packaging system 2000. For example, the inner heat shield 2004 can be a heat spreader or an electromagnetic interference (EMI) shield.

A top planar portion 2008 of the inner heat shield 2004 can be exposed from a package topside 2010 of the package encapsulation 2002. For example, a topside of the top planar portion 2008 can be exposed only at the corners of the package topside 2010 of the package encapsulation 2002. The top planar portion 2008 can be evenly spaced at the corners of the package topside 2010 of the package encapsulation 2002.

The integrated circuit packaging system 2000 can include a top substrate 2006, which is defined as a mounting structure for an integrated circuit or other electrical components as well as providing electrical connections between, to, and from the integrated circuit packaging system 2000. For example, the top substrate 2006 can be exposed from the center of the package topside 2010 of the package encapsulation 2002.

It has been discovered that the exposure of the topside of the top planar portion 2008 at the corners of the package topside 2010 allows the evenly spaced dissipation of heat from the center or interior of the integrated circuit packaging system 2000 to the external environment. The exposure of the top planar portion 2008 only at the corners of the package topside 2010 leaves maximum mounting surface on top of the package encapsulation 2002.

Figure 21:
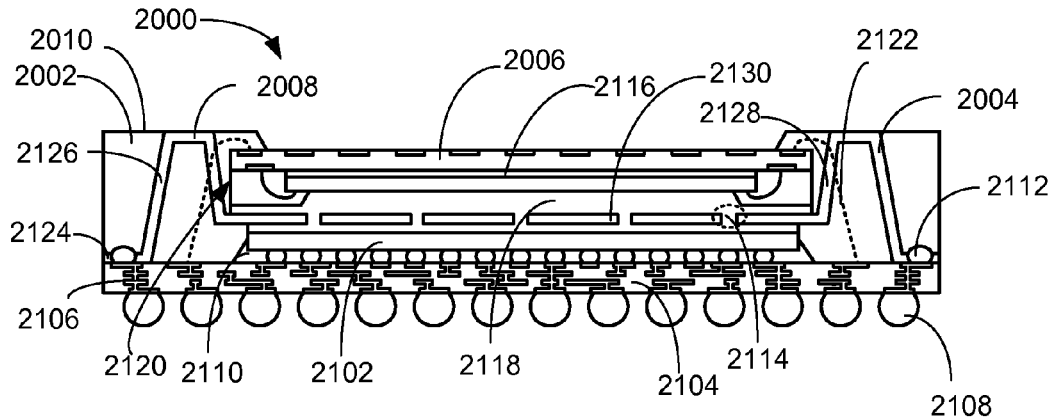
FIG. 21 is a cross-sectional view of the integrated circuit packaging system along the line 21-21 of FIG. 20.

Referring now to FIG. 21, therein is shown a cross-sectional view of the integrated circuit packaging system 2000 along the line 21-21 of FIG. 20. The integrated circuit packaging system 2000 can in include a bottom integrated circuit 2102 on a bottom substrate 2104 having a peripheral thermal via 2106 connected to a peripheral thermal interconnect 2108.

The bottom substrate 2104 is defined as a mounting structure for an integrated circuit or other electrical components as well as providing electrical connections between, to, and from the devices mounted thereto. For example, the bottom integrated circuit 2102 can be mounted over the topside of the bottom substrate 2104.

The bottom integrated circuit 2102 is defined as chip with active circuitry fabricated thereon. For example, the bottom integrated circuit 2102 can include a flip chip, a wire bonded chip, or a packaged integrated circuit. For further example, the bottom integrated circuit 2102 can be mounted over the bottom substrate 2104 with a bottom underfill 2110, which is defined as a structure that provides adhesion and rigidity for mounting an integrated circuit or electrical component on other integrated circuit or electrical component. For example, the bottom underfill 2110 can include a liquid epoxy mixture that provides rigidity and adhesion.

The peripheral thermal via 2106 is defined as a hole filled with electrically conductive material that provides a thermal path, a conductive path, or a combination thereof. For example, the peripheral thermal via 2106 can support the ground connection for the inner heat shield 2004. The peripheral thermal interconnect 2108 is defined as a connection interface for thermal connection to other components. For example, the peripheral thermal interconnect 2108 can include solder columns, solder balls, or conductive interconnects.

The integrated circuit packaging system 2000 can include a peripheral conductive adhesive 2112, which is defined as a thermally conductive material for holding components in place. For example, the peripheral conductive adhesive 2112 can include gel, thermally conductive epoxy, or thermally conductive polymer. For further example, the peripheral conductive adhesive 2112 can attach the inner heat shield 2004 to the topside of the bottom substrate 2104. For specific example, the peripheral conductive adhesive 2112 can attach the inner heat shield 2004 to the peripheral thermal via 2106 within the bottom substrate 2104.

The integrated circuit packaging system 2000 can include the inner heat shield 2004 over the bottom integrated circuit 2102 with the inner heat shield 2004 connected to the peripheral thermal via 2106. For example, the inner heat shield 2004 can represent a solid plate or can include a plate hole 2114.

The plate hole 2114 is defined as an opening on the inner heat shield 2004. For example, the inner heat shield 2004 can include multiple numbers of openings for the plate hole 2114. For further example, the plate hole 2114 can come in shapes of circle, triangle, square, or a combination thereof. For a specific example, the inner heat shield 2004 can have the plate hole 2114 with the inner heat shield 2004 between the bottom integrated circuit 2102 and a top integrated circuit 2116. More specifically, the inner heat shield 2004 having the plate hole 2114 can dissipate heat and can stabilize and lock an inner thermal adhesive 2118 applied over the inner heat shield 2004 between the bottom integrated circuit 2102 and the top integrated circuit 2116.

The inner heat shield 2004 can include a foot 2124. The peripheral conductive adhesive 2112 can connect the foot 2124 to the peripheral thermal via 2106. The inner heat shield 2004 can include a peripheral leg 2126 extending from the foot 2124. The top planar portion 2008 of the inner heat shield 2004 can extend from the peripheral leg 2126 with the topside of the top planar portion 2008 exposed. For another example, the top planar portion 2008 can be parallel with the topside of the bottom substrate 2104.

An inner support leg 2128 can extend from the top planar portion 2008 of the inner heat shield 2004. The peripheral leg 2126 and the inner support leg 2128 can connect to the top planar portion 2008 in an obtuse angle with the obtuse angle facing towards the bottom substrate 2104. For example, the inner support leg 2128 can be greater than half of the length of the peripheral leg 2126.

A central planar portion 2130 of the inner heat shield 2004 can extend from the inner support leg 2128. The central planar portion 2130 can extend over the bottom integrated circuit 2102 to connect to the inner support leg 2128 on the opposite end of the inner heat shield 2004.

It has been discovered that placing the inner heat shield 2004 on the bottom substrate 2104 provides better manufacturability of the integrated circuit packaging system 2000. By focusing the placement of the inner heat shield 2004 on the bottom substrate 2104, the production speed increases, thus, lowering the production cost.

The integrated circuit packaging system 2000 can include the inner thermal adhesive 2118, which is defined as a single structure that is thermally conductive material for holding components in place. For example, the inner thermal adhesive 2118 can include gel, thermally conductive epoxy, or thermally conductive polymer. The inner thermal adhesive 2118 can cover a topside and a bottom side of the central planar portion 2130 of the inner heat shield 2004. More specifically, the inner thermal adhesive 2118 can cover the non-active side of the bottom integrated circuit 2102 and all of the bottom side of an inner package 2120.

The integrated circuit packaging system 2000 can include the top integrated circuit 2116 mounted over the top substrate 2006. The top integrated circuit 2116 is defined as chip with active circuitry fabricated thereon. For example, the top integrated circuit 2116 can include a flip chip, a wire bonded chip, or a packaged integrated circuit.

The integrated circuit packaging system 2000 can include the inner package 2120 having the top integrated circuit 2116. The inner package 2120 is defined as a packaged integrated circuit that can be mounted on other package or structures, or receive other packages. For example, the inner package 2120 can include the top integrated circuit 2116 representing a wire bond chip. For further example, the active side of the top integrated circuit 2116 can face towards the inner heat shield 2004 while the active side of the bottom integrated circuit 2102 can face away from the inner heat shield 2004. Continuing with the example, the active side of the top integrated circuit 2116 can directly contact the inner thermal adhesive 2118.

It has been discovered that having the inner heat shield 2004, between the bottom integrated circuit 2102 and the top integrated circuit 2116, connected to the peripheral thermal via 2106 improves the thermal performance of the integrated circuit packaging system 2000. Having the inner heat shield 2004 embedded between the bottom integrated circuit 2102 and the top integrated circuit 2116 improves efficiency for heat dissipation for both integrated circuits.

It has been also discovered that the inner heat shield 2004 can provide electromagnetic isolation between the bottom integrated circuit 2102 and the top integrated circuit 2116 to avoid electromagnetic interference between the two integrated circuits. The peripheral thermal via 2106 is connected to the peripheral thermal interconnect 2108, which provides further dissipation of heat from the integrated circuit packaging system 2000. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 2000 can include an electrical interconnect 2122, which is defined as a connection interface for electrical connection to other components. For example, the electrical interconnect 2122 can include a bondwire, solder columns, solder balls, or conductive interconnects. For this example, the electrical interconnect 2122 can represent a bondwire for z-interconnect between the top substrate 2006 and the bottom substrate 2104. For illustrative purposes, the electrical interconnect 2122 is drawn as a dotted line to show that the cross-sectional view can show more than one of the electrical interconnect 2122.

The package encapsulation 2002 can be formed over the bottom integrated circuit 2102, the inner heat shield 2004, and the top integrated circuit 2116 with the top planar portion 2008 of the inner heat shield 2004 coplanar with the package topside 2010 of the package encapsulation 2002. For example, the package encapsulation 2002 can be formed with the topside of the top substrate 2006 exposed.

It has been discovered the connection between the inner heat shield 2004 and the peripheral thermal via 2106 and the top planar portion 2008 being exposed at the package topside 2010 of the package encapsulation 2002 allows the evenly spaced dissipation of heat from the center or interior of the integrated circuit packaging system 2000 to the external environment. This evenly spaced and maximum separation allow maximum thermal conduction path away from the heat generating integrated circuits to the external environment.

Figure 22:
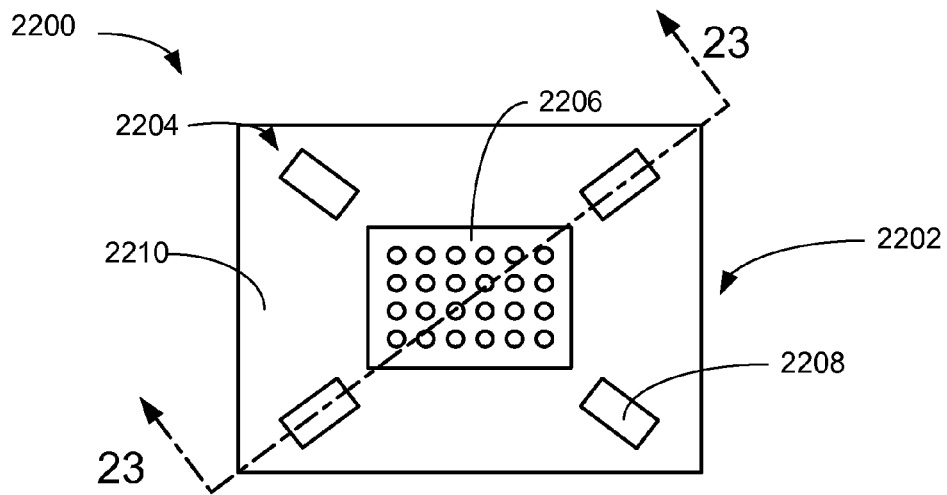
FIG. 22 is a top view of an integrated circuit packaging system in a seventh embodiment of the present invention.

Referring now to FIG. 22, therein is shown a top view of an integrated circuit packaging system 2200 in a seventh embodiment of the present invention. The integrated circuit packaging system 2200 can include a package encapsulation 2202. The package encapsulation 2202 is defined as a cover surrounding and protecting the contents in the integrated circuit packaging system 2200 from the environment and hermetically seals the contents internal to the integrated circuit packaging system. The package encapsulation 2202 can be an epoxy molding, protective molding, or encasement structure.

The integrated circuit packaging system 2200 can include an inner heat shield 2204, which is defined as a conductive structure that transfers heat generated within the integrated circuit packaging system 2200 to the external environment. The term "external" refers to outside the integrated circuit packaging system 2200. For example, the inner heat shield 2204 can be a heat spreader or an electromagnetic interference (EMI) shield.

A top planar portion 2208 of the inner heat shield 2204 can be exposed from a package topside 2210 of the package encapsulation 2202. For example, a topside of the top planar portion 2208 can be exposed only at the corners of the package topside 2210 of the package encapsulation 2202. The top planar portion 2208 can be evenly spaced at the corners of the package topside 2210 of the package encapsulation 2202.

The integrated circuit packaging system 2200 can include a top substrate 2206, which is defined as a mounting structure for an integrated circuit or other electrical components as well as providing electrical connections between, to, and from the integrated circuit packaging system 2200. For example, the top substrate 2206 can be exposed from the center of the package topside 2210 of the package encapsulation 2202.

It has been discovered that the exposure of the topside of the top planar portion 2208 at the corners of the package topside 2210 allows the evenly spaced dissipation of heat from the center or interior of the integrated circuit packaging system 2200 to the external environment. The exposure of the top planar portion 2208 only at the corners of the package topside 2210 leaves maximum mounting surface on top of the package encapsulation 2202.

Figure 23:
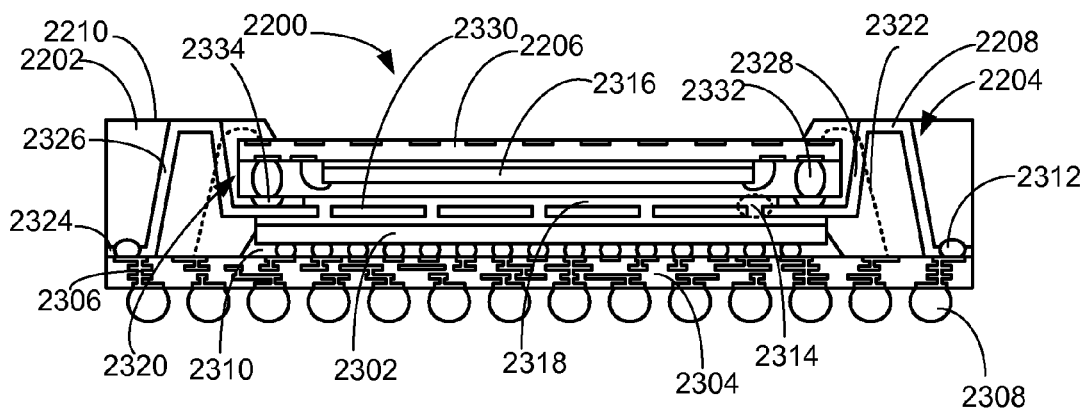
FIG. 23 is a cross-sectional view of the integrated circuit packaging system along the line 23-23 of FIG. 22.

Referring now to FIG. 23, therein is shown a cross-sectional view of the integrated circuit packaging system 2200 along the line 23-23 of FIG. 22. The integrated circuit packaging system 2200 can in include a bottom integrated circuit 2302 on a bottom substrate 2304 having a peripheral thermal via 2306 connected to a peripheral thermal interconnect 2308.

The bottom substrate 2304 is defined as a mounting structure for an integrated circuit or other electrical components as well as providing electrical connections between, to, and from the devices mounted thereto. For example, the bottom integrated circuit 2302 can be mounted over the topside of the bottom substrate 2304.

The bottom integrated circuit 2302 is defined as chip with active circuitry fabricated thereon. For example, the bottom integrated circuit 2302 can include a flip chip, a wire bonded chip, or a packaged integrated circuit. For further example, the bottom integrated circuit 2302 can be mounted over the bottom substrate 2304 with a bottom underfill 2310, which is defined as a structure that provides adhesion and rigidity for mounting an integrated circuit or electrical component on other integrated circuit or electrical component. For example, the bottom underfill 2310 can include a liquid epoxy mixture that provides rigidity and adhesion.

The peripheral thermal via 2306 is defined as a hole filled with electrically conductive material that provides a thermal path, a conductive path, or a combination thereof. For example, the peripheral thermal via 2306 can support the ground connection for the inner heat shield 2204. The peripheral thermal interconnect 2308 is defined as a connection interface for thermal connection to other components. For example, the peripheral thermal interconnect 2308 can include solder columns, solder balls, or conductive interconnects.

The integrated circuit packaging system 2200 can include a peripheral conductive adhesive 2312, which is defined as a thermally conductive material for holding components in place. For example, the peripheral conductive adhesive 2312 can include gel, thermally conductive epoxy, or thermally conductive polymer. For further example, the peripheral conductive adhesive 2312 can attach the inner heat shield 2204 to the topside of the bottom substrate 2304. For specific example, the peripheral conductive adhesive 2312 can attach the inner heat shield 2204 to the peripheral thermal via 2306 within the bottom substrate 2304.

The integrated circuit packaging system 2200 can include the inner heat shield 2204 over the bottom integrated circuit 2302 with the inner heat shield 2204 connected to the peripheral thermal via 2306. For example, the inner heat shield 2204 can represent a solid plate or can include a plate hole 2314.

The plate hole 2314 is defined as an opening on the inner heat shield 2204. For example, the inner heat shield 2204 can include multiple numbers of openings for the plate hole 2314. For further example, the plate hole 2314 can come in shapes of circle, triangle, square, or a combination thereof. For a specific example, the inner heat shield 2204 can have the plate hole 2314 with the inner heat shield 2204 between the bottom integrated circuit 2302 and a top integrated circuit 2316. More specifically, the inner heat shield 2204 having the plate hole 2314 can dissipate heat and can stabilize and lock an inner thermal adhesive 2318 applied over the inner heat shield 2204 between the bottom integrated circuit 2302 and the top integrated circuit 2316.

The inner heat shield 2204 can include a foot 2324. The peripheral conductive adhesive 2312 can connect the foot 2324 to the peripheral thermal via 2306. The inner heat shield 2204 can include a peripheral leg 2326 extending from the foot 2324. The top planar portion 2208 of the inner heat shield 2204 can extend from the peripheral leg 2326 with the topside of the top planar portion 2208 exposed. For another example, the top planar portion 2208 can be parallel with the topside of the bottom substrate 2304.

An inner support leg 2328 can extend from the top planar portion 2208 of the inner heat shield 2204. The peripheral leg 2326 and the inner support leg 2328 can connect to the top planar portion 2208 in an obtuse angle with the obtuse angle facing towards the bottom substrate 2304. For example, the inner support leg 2328 can be greater than half of the length of the peripheral leg 2326.

A central planar portion 2330 of the inner heat shield 2204 can extend from the inner support leg 2328. The central planar portion 2330 can extend over the bottom integrated circuit 2302 to connect to the inner support leg 2328 on the opposite end of the inner heat shield 2204.

It has been discovered that placing the inner heat shield 2204 on the bottom substrate 2304 provides better manufacturability of the integrated circuit packaging system 2200. By focusing the placement of the inner heat shield 2204 on the bottom substrate 2304, the production speed increases, thus, lowering the production cost.

The integrated circuit packaging system 2200 can include the inner thermal adhesive 2318, which is defined as a single structure that is thermally conductive material for holding components in place. For example, the inner thermal adhesive 2318 can include gel, thermally conductive epoxy, or thermally conductive polymer. The inner thermal adhesive 2318 can cover a topside and a bottom side of the central planar portion 2330 of the inner heat shield 2204. More specifically, the inner thermal adhesive 2318 can cover the non-active side of the bottom integrated circuit 2302 and the portion of the top side of the central planar portion 2330 between two structures representing an inner conductive adhesive 2334.

The integrated circuit packaging system 2200 can include the top integrated circuit 2316 mounted over the top substrate 2206. The top integrated circuit 2316 is defined as chip with active circuitry fabricated thereon. For example, the top integrated circuit 2316 can include a flip chip, a wire bonded chip, or a packaged integrated circuit.

The integrated circuit packaging system 2200 can include an inner package 2320 having the top integrated circuit 2316. The inner package 2320 is defined as a packaged integrated circuit that can be mounted on other package or structures, or receive other packages. For example, the inner package 2320 can include the top integrated circuit 2316 representing a wire bond chip. For further example, the active side of the top integrated circuit 2316 can face towards the inner heat shield 2204 while the active side of the bottom integrated circuit 2302 can face away from the inner heat shield 2204.

For another example, the inner package 2320 can have a top thermal interconnect 2332 embedded in the inner package 2320. The top thermal interconnect 2332 is defined as a connection interface for thermal connection to other components. For example, the top substrate 2206 of the inner package 2320 can connect to the inner heat shield 2204 through the top thermal interconnect 2332 and the inner conductive adhesive 2334. For another example, the top thermal interconnect 2332 can represent an embedded solder on pad (e-SOP).

The inner conductive adhesive 2334 is defined as a thermally conductive material for holding components in place. For example, the inner conductive adhesive 2334 can connect the inner package 2320 to the inner heat shield 2204 with the inner conductive adhesive 2334.

It has been discovered that having the inner heat shield 2204, between the bottom integrated circuit 2302 and the top integrated circuit 2316, connected to the peripheral thermal via 2306 improves the thermal performance of the integrated circuit packaging system 2200. Having the inner heat shield 2204 embedded between the bottom integrated circuit 2302 and the top integrated circuit 2316 improves efficiency for heat dissipation for both integrated circuits.

It has been also discovered that the inner heat shield 2204 can provide electromagnetic isolation between the bottom integrated circuit 2302 and the top integrated circuit 2316 to avoid electromagnetic interference between the two integrated circuits. The peripheral thermal via 2306 is connected to the peripheral thermal interconnect 2308, which provides further dissipation of heat from the integrated circuit packaging system 2200. Improving the thermal performance of the integrated circuits increases board level reliability and performance of the semiconductor device. The thermally-enhanced package design of the present invention can be applied to various semiconductor devices, thus, lowering the production cost.

It has further been discovered that embedding the top thermal interconnect 2332 in the inner package 2320 can reduce grounding by an electrical interconnect 2322. As a result, the top integrated circuit 2316 can ground through the top thermal interconnect 2332, thus, enhancing electrical performance by the top integrated circuit 2316.

The integrated circuit packaging system 2200 can include the electrical interconnect 2322, which is defined as a connection interface for electrical connection to other components. For example, the electrical interconnect 2322 can include a bondwire, solder columns, solder balls, or conductive interconnects. For this example, the electrical interconnect 2322 can represent a bondwire for z-interconnect between the top substrate 2206 and the bottom substrate 2304. For illustrative purposes, the electrical interconnect 2322 is drawn as a dotted line to show that the cross-sectional view can show more than one of the electrical interconnect 2322.

The package encapsulation 2202 can be formed over the bottom integrated circuit 2302, the inner heat shield 2204, and the top integrated circuit 2316 with the top planar portion 2208 of the inner heat shield 2204 coplanar with the package topside 2210 of the package encapsulation 2202. For example, the package encapsulation 2202 can be formed with the topside of the top substrate 2206 exposed.

It has been discovered the connection between the inner heat shield 2204 and the peripheral thermal via 2306 and the top planar portion 2208 being exposed at the package topside 2210 of the package encapsulation 2202 allows the evenly spaced dissipation of heat from the center or interior of the integrated circuit packaging system 2200 to the external environment. This evenly spaced and maximum separation allow maximum thermal conduction path away from the heat generating integrated circuits to the external environment.

Figure 24:
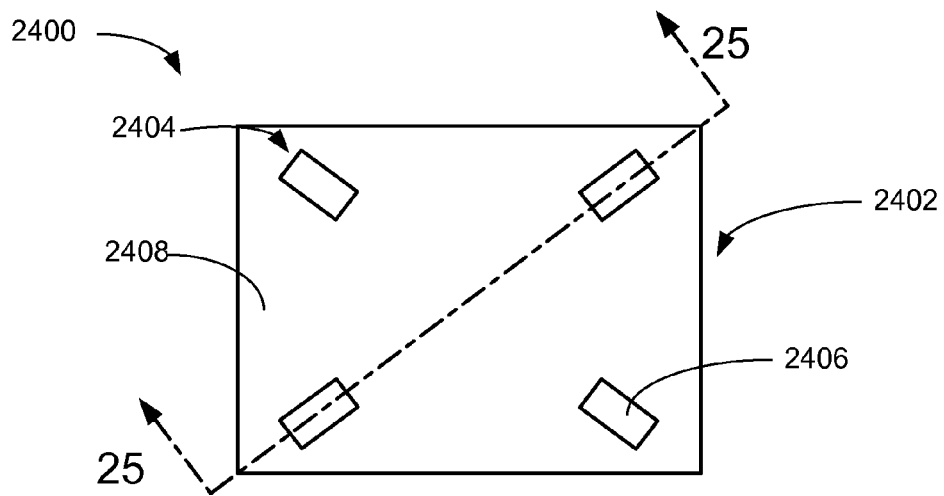
FIG. 24 is a top view of an integrated circuit packaging system in an eighth embodiment of the present invention.

Referring now to FIG. 24, therein is shown a top view of an integrated circuit packaging system 2400 in an eighth embodiment of the present invention. The integrated circuit packaging system 2400 can include a package encapsulation 2402. The package encapsulation 2402 is defined as a cover surrounding and protecting the contents in the integrated circuit packaging system 2400 from the environment and hermetically seals the contents internal to the integrated circuit packaging system. The package encapsulation 2402 can be an epoxy molding, protective molding, or encasement structure.

The integrated circuit packaging system 2400 can include an inner heat shield 2404, which is defined as a conductive structure that transfers heat generated within the integrated circuit packaging system 2400 to the external environment. The term "external" refers to outside the integrated circuit packaging system 2400. For example, the inner heat shield 2404 can include a heat spreader or an EMI shield.

A top planar portion 2406 of the inner heat shield 2404 can be exposed from a package topside 2408 of the package encapsulation 2402. For example, a topside of the top planar portion 2406 can be exposed only at the corners of the package topside 2408 of the package encapsulation 2402. The top planar portion 2406 can be evenly spaced at the corners of the package topside 2408 of the package encapsulation 2402.

It has been discovered that the exposure of the topside of the top planar portion 2406 at the corners of the package topside 2408 allows the evenly spaced dissipation of heat from the center or interior of the integrated circuit packaging system 2400 to the external environment. The exposure of the top planar portion 2406 only at the corners of the package topside 2408 leaves maximum mounting surface on top of the package encapsulation 2402.

Figure 25:
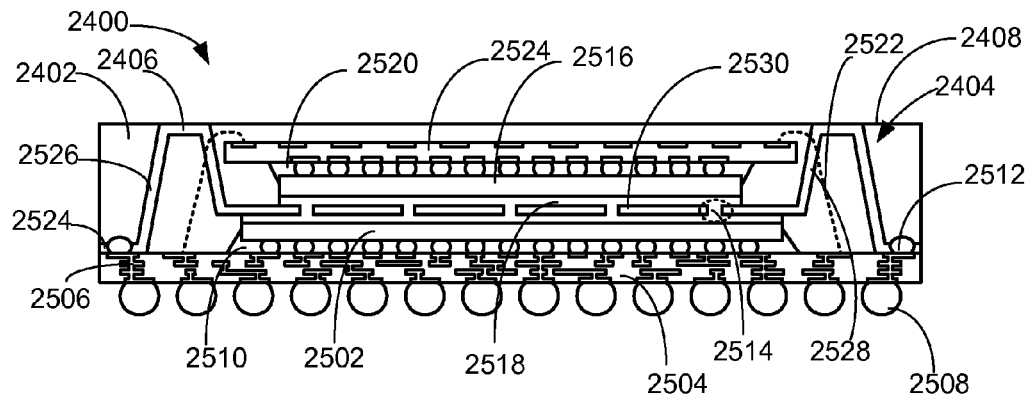
FIG. 25 is a cross-sectional view of the integrated circuit packaging system along the line 25-25 of FIG. 24.

Referring now to FIG. 25, therein is shown a cross-sectional view of the integrated circuit packaging system 2400 along the line 25-25 of FIG. 24. The integrated circuit packaging system 2400 can in include a bottom integrated circuit 2502 on a bottom substrate 2504 having a peripheral thermal via 2506 connected to a peripheral thermal interconnect 2508.

The bottom substrate 2504 is defined as a mounting structure for an integrated circuit or other electrical components as well as providing electrical connections between, to, and from the devices mounted thereto. For example, the bottom integrated circuit 2502 can be mounted over the topside of the bottom substrate 2504.

The bottom integrated circuit 2502 is defined as chip with active circuitry fabricated thereon. For example, the bottom integrated circuit 2502 can include a flip chip, a wire bonded chip, or a packaged integrated circuit. For further example, the bottom integrated circuit 2502 can be mounted over the bottom substrate 2504 with a bottom underfill 2510, which is defined as a structure that provides adhesion and rigidity for mounting an integrated circuit or electrical component on other integrated circuit or electrical component. For example, the bottom underfill 2510 can include a liquid epoxy mixture that provides rigidity and adhesion.

The peripheral thermal via 2506 is defined as a hole filled with electrically conductive material that provides a thermal path, a conductive path, or a combination thereof. For example, the peripheral thermal via 2506 can support the ground connection for the inner heat shield 2404. The peripheral thermal interconnect 2508 is defined as a connection interface for thermal connection to other components. For example, the peripheral thermal interconnect 2508 can include solder columns, solder balls, or conductive interconnects.

The integrated circuit packaging system 2400 can include a peripheral conductive adhesive 2512, which is defined as a thermally conductive material for holding components in place. For example, the peripheral conductive adhesive 2512 can include gel, thermally conductive epoxy, or thermally conductive polymer. For further example, the peripheral conductive adhesive 2512 can attach the inner heat shield 2404 to the topside of the bottom substrate 2504. For specific example, the peripheral conductive adhesive 2512 can attach the inner heat shield 2404 to the peripheral thermal via 2506 within the bottom substrate 2504.

The integrated circuit packaging system 2400 can include the inner heat shield 2404 over the bottom integrated circuit 2502 with the inner heat shield 2404 connected to the peripheral thermal via 2506. For example, the inner heat shield 2404 can represent a solid plate or can include a plate hole 2514.

The plate hole 2514 is defined as an opening on the inner heat shield 2404. For example, the inner heat shield 2404 can include multiple numbers of openings for the plate hole 2514. For further example, the plate hole 2514 can come in shapes of circle, triangle, square, or a combination thereof. For a specific example, the inner heat shield 2404 can have the plate hole 2514 with the inner heat shield 2404 between the bottom integrated circuit 2502 and a top integrated circuit 2516. More specifically, the inner heat shield 2404 having the plate hole 2514 can dissipate heat and can stabilize and lock an inner thermal adhesive 2518 applied over the inner heat shield 2404 between the bottom integrated circuit 2502 and the top integrated circuit 2516.

The inner heat shield 2404 can include a foot 2524. The peripheral conductive adhesive 212 can connect the foot 2524 to the peripheral thermal via 2506. The inner heat shield 2404 can include a peripheral leg 2526 extending from the foot 2524. The top planar portion 2406 of the inner heat shield 2404 can extend from the peripheral leg 2526 with the topside of the top planar portion 2406 exposed. For another example, the top planar portion 2406 can be parallel with the topside of the bottom substrate 2504.

An inner support leg 2528 can extend from the top planar portion 2406 of the inner heat shield 2404. The peripheral leg 2526 and the inner support leg 2528 can connect to the top planar portion 2406 in an obtuse angle with the obtuse angle facing towards the bottom substrate 2504. For example, the inner support leg 2528 can be greater than half of the length of the peripheral leg 2526.

A central planar portion 2530 of the inner heat shield 2404 can extend from the inner support leg 2528. The central planar portion 2530 can extend over the bottom integrated circuit 2502 to connect to the inner support leg 2528 on the opposite end of the inner heat shield 2404.

It has been discovered that placing the inner heat shield 2404 on the bottom substrate 2504 provides better manufacturability of the integrated circuit packaging system 2400. By focusing the placement of the inner heat shield 2404 on the bottom substrate 2504, the production speed increases, thus, lowering the production cost.

The integrated circuit packaging system 2400 can include the inner thermal adhesive 2518, which is defined as a single structure that is thermally conductive material for holding components in place. For example, the inner thermal adhesive 2518 can include gel, thermally conductive epoxy, or thermally conductive polymer. The inner thermal adhesive 2518 can cover a topside and a bottom side of the central planar portion 2530 of the inner heat shield 2404. More specifically, the inner thermal adhesive 2518 can cover the non-active side of the bottom integrated circuit 2502 and the top integrated circuit 2516.

The integrated circuit packaging system 2400 can include a top substrate 2534, which is defined as a mounting structure for an integrated circuit or other electrical components as well as providing electrical connections between, to, and from the devices mounted thereto. The integrated circuit packaging system 2400 can include the top integrated circuit 2516 mounted over the top substrate 2534. The top integrated circuit 2516 is defined as chip with active circuitry fabricated thereon. For example, the top integrated circuit 2516 can include a flip chip, a wire bonded chip, or a packaged integrated circuit. Continuing with the example, the active side of the top integrated circuit 2516 and the active side of the bottom integrated circuit 2502 can face away from the inner heat shield 2404.

For further example, the top integrated circuit 2516 can be mounted over the top substrate 2534 with a top underfill 2520, which is defined as a structure that provides adhesion and rigidity for mounting an integrated circuit or electrical component on other integrated circuit or electrical component. For example, the top underfill 2520 can include a liquid epoxy mixture that provides rigidity and adhesion.

It has been discovered that having the inner heat shield 2404, between the bottom integrated circuit 2502 and the top integrated circuit 2516, connected to the peripheral thermal via 2506 improves the thermal performance of the integrated circuit packaging system 2400. Having the inner heat shield 2404 embedded between the bottom integrated circuit 2502 and the top integrated circuit 2516 improves efficiency for heat dissipation for both integrated circuits.

It has been also discovered that the inner heat shield 2404 can provide electromagnetic isolation between the bottom integrated circuit 2502 and the top integrated circuit 2516 to avoid electromagnetic interference between the two integrated circuits. The peripheral thermal via 2506 is connected to the peripheral thermal interconnect 2508, which provides further dissipation of heat from the integrated circuit packaging system 2400. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 2400 can include an electrical interconnect 2522, which is defined as a connection interface for electrical connection to other components. For example, the electrical interconnect 2522 can include a bondwire, solder columns, solder balls, or conductive interconnects. For this example, the electrical interconnect 2522 can represent a bondwire for z-interconnect between the top substrate 2534 and the bottom substrate 2504. For illustrative purposes, the electrical interconnect 2522 is drawn as a dotted line to show that the cross-sectional view can show more than one of the electrical interconnect 2522.

The package encapsulation 2402 can be formed over the bottom integrated circuit 2502, the inner heat shield 2404, and the top integrated circuit 2516 with the top planar portion 2406 of the inner heat shield 2404 coplanar with the package topside 2408 of the package encapsulation 2402. The package encapsulation 2402 can cover the top substrate 2534.

It has been discovered the connection between the inner heat shield 2404 and the peripheral thermal via 2506 and the top planar portion 2406 being exposed at the package topside 2408 of the package encapsulation 2402 allows the evenly spaced dissipation of heat from the center or interior of the integrated circuit packaging system 2400 to the external environment. This evenly spaced and maximum separation allow maximum thermal conduction path away from the heat generating integrated circuits to the external environment.

Figure 26:
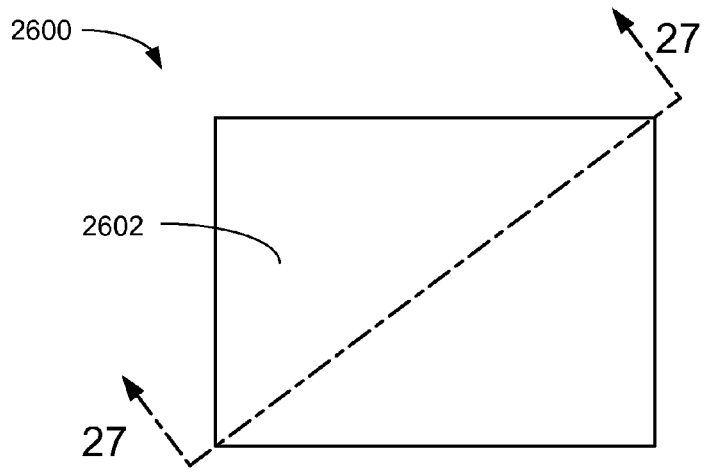
FIG. 26 is a top view of an integrated circuit packaging system in a ninth embodiment of the present invention.

Referring now to FIG. 26, therein is shown a top view of an integrated circuit packaging system 2600 in a ninth embodiment of the present invention. The integrated circuit packaging system 2600 can include a top heat shield 2602, which is defined as a conductive structure that transfers heat generated within the integrated circuit packaging system 2600 to the external environment. The term "external" refers to outside the integrated circuit packaging system 2600.

Figure 27:
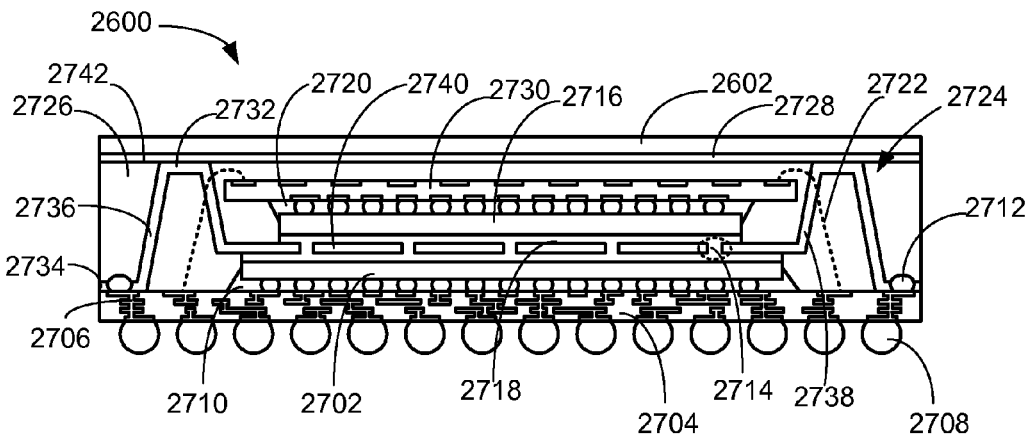
FIG. 27 is a cross-sectional view of the integrated circuit packaging system along the line 27-27 of FIG. 26.

Referring now to FIG. 27, therein is shown a cross-sectional view of the integrated circuit packaging system 2600 along the line 27-27 of FIG. 26. The integrated circuit packaging system 2600 can include a package encapsulation 2726. The package encapsulation 2726 is defined as a cover surrounding and protecting the contents in the integrated circuit packaging system 2600 from the environment and hermetically seals the contents internal to the integrated circuit packaging system. The package encapsulation 2726 can be an epoxy molding, protective molding, or encasement structure.

The integrated circuit packaging system 2600 can include an inner heat shield 2724, which is defined as a conductive structure that transfers heat generated within the integrated circuit packaging system 2600 to the external environment. For example, the inner heat shield 2724 can include a heat spreader or an EMI shield. The integrated circuit packaging system 2600 can in include a bottom integrated circuit 2702 on a bottom substrate 2704 having a peripheral thermal via 2706 connected to a peripheral thermal interconnect 2708.

The bottom substrate 2704 is defined as a mounting structure for an integrated circuit or other electrical components as well as providing electrical connections between, to, and from the devices mounted thereto. For example, the bottom integrated circuit 2702 can be mounted over the topside of the bottom substrate 2704.

The bottom integrated circuit 2702 is defined as chip with active circuitry fabricated thereon. For example, the bottom integrated circuit 2702 can include a flip chip, a wire bonded chip, or a packaged integrated circuit. For further example, the bottom integrated circuit 2702 can be mounted over the bottom substrate 2704 with a bottom underfill 2710, which is defined as a structure that provides adhesion and rigidity for mounting an integrated circuit or electrical component on other integrated circuit or electrical component. For example, the bottom underfill 2710 can include a liquid epoxy mixture that provides rigidity and adhesion.

The peripheral thermal via 2706 is defined as a hole filled with electrically conductive material that provides a thermal path, a conductive path, or a combination thereof. For example, the peripheral thermal via 2706 can support the ground connection for the inner heat shield 2724. The peripheral thermal interconnect 2708 is defined as a connection interface for thermal connection to other components. For example, the peripheral thermal interconnect 2708 can include solder columns, solder balls, or conductive interconnects.

The integrated circuit packaging system 2600 can include a peripheral conductive adhesive 2712, which is defined as a thermally conductive material for holding components in place. For example, the peripheral conductive adhesive 2712 can include gel, thermally conductive epoxy, or thermally conductive polymer. For further example, the peripheral conductive adhesive 2712 can attach the inner heat shield 2724 to the topside of the bottom substrate 2704. For specific example, the peripheral conductive adhesive 2712 can attach the inner heat shield 2724 to the peripheral thermal via 2706 within the bottom substrate 2704.

The integrated circuit packaging system 2600 can include the inner heat shield 2724 over the bottom integrated circuit 2702 with the inner heat shield 2724 connected to the peripheral thermal via 2706. For example, the inner heat shield 2724 can represent a solid plate or can include a plate hole 2714.

The plate hole 2714 is defined as an opening on the inner heat shield 2724. For example, the inner heat shield 2724 can include multiple numbers of openings for the plate hole 2714. For further example, the plate hole 2714 can come in shapes of circle, triangle, square, or a combination thereof. For a specific example, the inner heat shield 2724 can have the plate hole 2714 with the inner heat shield 2724 between the bottom integrated circuit 2702 and a top integrated circuit 2716. More specifically, the inner heat shield 2724 having the plate hole 2714 can dissipate heat and can stabilize and lock an inner thermal adhesive 2718 applied over the inner heat shield 2724 between the bottom integrated circuit 2702 and the top integrated circuit 2716.

The inner heat shield 2724 can include a foot 2734. The peripheral conductive adhesive 212 can connect the foot 2734 to the peripheral thermal via 2706. The inner heat shield 2724 can include a peripheral leg 2736 extending from the foot 2734. A top planar portion 2732 of the inner heat shield 2724 can extend from the peripheral leg 2736 with the topside of the top planar portion 2732 exposed. For another example, the top planar portion 2732 can be parallel with the topside of the bottom substrate 2704.

An inner support leg 2738 can extend from the top planar portion 2732 of the inner heat shield 2724. The peripheral leg 2736 and the inner support leg 2738 can connect to the top planar portion 2732 in an obtuse angle with the obtuse angle facing towards the bottom substrate 2704. For example, the inner support leg 2738 can be greater than half of the length of the peripheral leg 2736.

A central planar portion 2740 of the inner heat shield 2724 can extend from the inner support leg 2738. The central planar portion 2740 can extend over the bottom integrated circuit 2702 to connect to the inner support leg 2738 on the opposite end of the inner heat shield 2724.

It has been discovered that placing the inner heat shield 2724 on the bottom substrate 2704 provides better manufacturability of the integrated circuit packaging system 2600. By focusing the placement of the inner heat shield 2724 on the bottom substrate 2704, the production speed increases, thus, lowering the production cost.

The integrated circuit packaging system 2600 can include the inner thermal adhesive 2718, which is defined as a single structure that is thermally conductive material for holding components in place. For example, the inner thermal adhesive 2718 can include gel, thermally conductive epoxy, or thermally conductive polymer. The inner thermal adhesive 2718 can cover a topside and a bottom side of the central planar portion 2740 of the inner heat shield 2724. More specifically, the inner thermal adhesive 2718 can cover the non-active side of the bottom integrated circuit 2702 and the top integrated circuit 2716.

The integrated circuit packaging system 2600 can include a top substrate 2730, which is defined as a mounting structure for an integrated circuit or other electrical components as well as providing electrical connections between, to, and from the devices mounted thereto. The integrated circuit packaging system 2600 can include the top integrated circuit 2716 mounted over the top substrate 2730. The top integrated circuit 2716 is defined as chip with active circuitry fabricated thereon. For example, the top integrated circuit 2716 can include a flip chip, a wire bonded chip, or a packaged integrated circuit. Continuing with the example, the active side of the top integrated circuit 2716 and the active side of the bottom integrated circuit 2702 can face away from the inner heat shield 2724.

For further example, the top integrated circuit 2716 can be mounted over the top substrate 2730 with a top underfill 2720, which is defined as a structure that provides adhesion and rigidity for mounting an integrated circuit or electrical component on other integrated circuit or electrical component. For example, the top underfill 2720 can include a liquid epoxy mixture that provides rigidity and adhesion.

It has been discovered that having the inner heat shield 2724, between the bottom integrated circuit 2702 and the top integrated circuit 2716, connected to the peripheral thermal via 2706 improves the thermal performance of the integrated circuit packaging system 2600. Having the inner heat shield 2724 embedded between the bottom integrated circuit 2702 and the top integrated circuit 2716 improves efficiency for heat dissipation for both integrated circuits.

It has been also discovered that the inner heat shield 2724 can provide electromagnetic isolation between the bottom integrated circuit 2702 and the top integrated circuit 2716 to avoid electromagnetic interference between the two integrated circuits. The peripheral thermal via 2706 is connected to the peripheral thermal interconnect 2708, which provides further dissipation of heat from the integrated circuit packaging system 2600. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 2600 can include an electrical interconnect 2722, which is defined as a connection interface for electrical connection to other components. For example, the electrical interconnect 2722 can include a bondwire, solder columns, solder balls, or conductive interconnects. For this example, the electrical interconnect 2722 can represent a bondwire for z-interconnect between the top substrate 2730 and the bottom substrate 2704. For illustrative purposes, the electrical interconnect 2722 is drawn as a dotted line to show that the cross-sectional view can show more than one of the electrical interconnect 2722.

The package encapsulation 2726 can be formed over the bottom integrated circuit 2702, the inner heat shield 2724, and the top integrated circuit 2716 with the top planar portion 2732 of the inner heat shield 2724 coplanar with a package topside 2742 of the package encapsulation 2726. The package encapsulation 2726 can cover the top substrate 2730.

The integrated circuit packaging system 2600 can include a top conductive adhesive 2728, which is defined as a thermally conductive material for holding components in place. For example, the top conductive adhesive 2728 can cover the package topside 2742 of the package encapsulation 2726. For further example, the top heat shield 2602 can be placed on the top conductive adhesive 2728 for thermal conductivity between the inner heat shield 2724 and the top heat shield 2602 through the top conductive adhesive 2728.

It has been discovered the connection between the inner heat shield 2724, the peripheral thermal via 2706, the top planar portion 2732, the top conductive adhesive 2728, and the top heat shield 2602 allows the evenly spaced dissipation of heat from the center or interior of the integrated circuit packaging system 2600 to the external environment. This evenly spaced and maximum separation allow maximum thermal conduction path away from the heat generating integrated circuits to the external environment.

Figure 28:
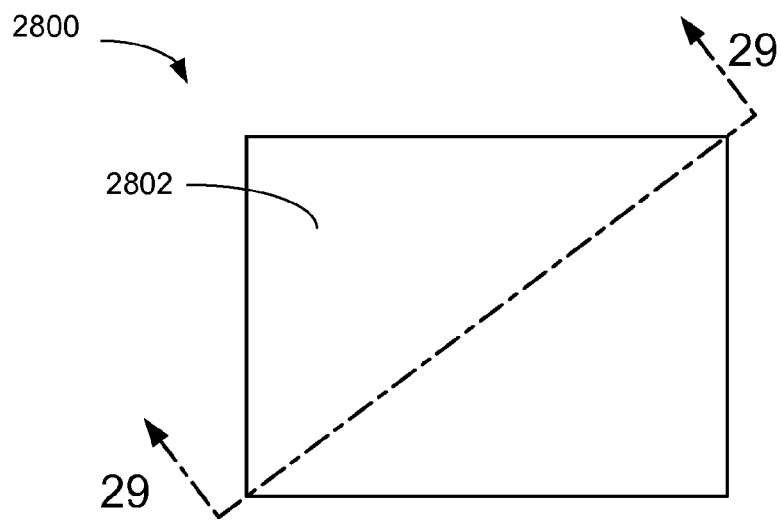
FIG. 28 is a top view of an integrated circuit packaging system in a tenth embodiment of the present invention.

Referring now to FIG. 28, therein is shown a top view of an integrated circuit packaging system 2800 in a tenth embodiment of the present invention. The integrated circuit packaging system 2800 can include a top heat shield 2802, which is defined as a conductive structure that transfers heat generated within the integrated circuit packaging system 2800 to the external environment. The term "external" refers to outside the integrated circuit packaging system 2800.

Figure 29:
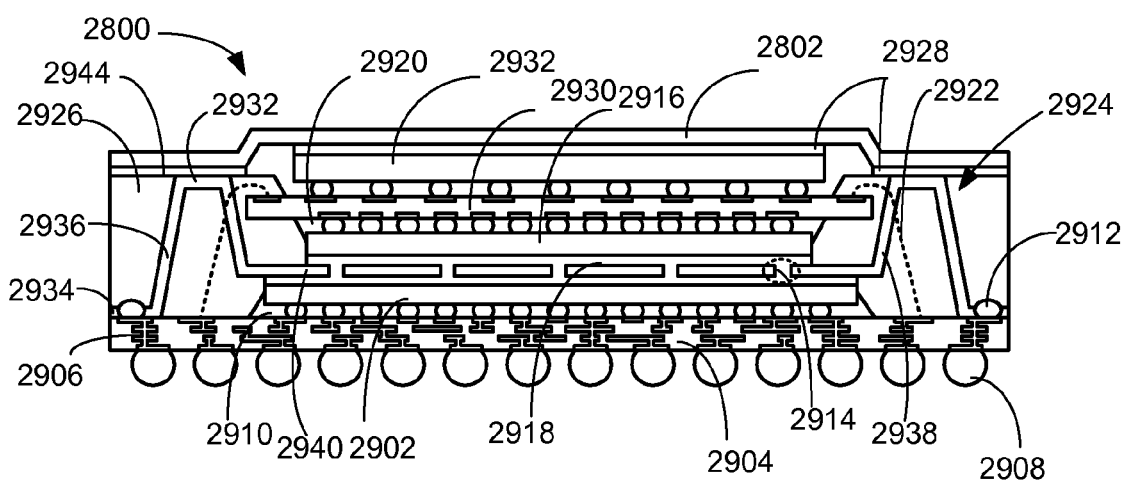
FIG. 29 is a cross-sectional view of the integrated circuit packaging system along the line 29-29 of FIG. 28.

Referring now to FIG. 29, therein is shown a cross-sectional view of the integrated circuit packaging system 2800 along the line 29-29 of FIG. 28. The integrated circuit packaging system 2800 can include a package encapsulation 2926. The package encapsulation 2926 is defined as a cover surrounding and protecting the contents in the integrated circuit packaging system 2800 from the environment and hermetically seals the contents internal to the integrated circuit packaging system. The package encapsulation 2926 can be an epoxy molding, protective molding, or encasement structure.

The integrated circuit packaging system 2800 can include an inner heat shield 2924, which is defined as a conductive structure that transfers heat generated within the integrated circuit packaging system 2800 to the external environment. For example, the inner heat shield 2924 can include a heat spreader or an EMI shield. The integrated circuit packaging system 2800 can in include a bottom integrated circuit 2902 on a bottom substrate 2904 having a peripheral thermal via 2906 connected to a peripheral thermal interconnect 2908.

The bottom substrate 2904 is defined as a mounting structure for an integrated circuit or other electrical components as well as providing electrical connections between, to, and from the devices mounted thereto. For example, the bottom integrated circuit 2902 can be mounted over the topside of the bottom substrate 2904.

The bottom integrated circuit 2902 is defined as chip with active circuitry fabricated thereon. For example, the bottom integrated circuit 2902 can include a flip chip, a wire bonded chip, or a packaged integrated circuit. For further example, the bottom integrated circuit 2902 can be mounted over the bottom substrate 2904 with a bottom underfill 2910, which is defined as a structure that provides adhesion and rigidity for mounting an integrated circuit or electrical component on other integrated circuit or electrical component. For example, the bottom underfill 2910 can include a liquid epoxy mixture that provides rigidity and adhesion.

The peripheral thermal via 2906 is defined as a hole filled with electrically conductive material that provides a thermal path, a conductive path, or a combination thereof. For example, the peripheral thermal via 2906 can support the ground connection for the inner heat shield 2924. The peripheral thermal interconnect 2908 is defined as a connection interface for thermal connection to other components. For example, the peripheral thermal interconnect 2908 can include solder columns, solder balls, or conductive interconnects.

The integrated circuit packaging system 2800 can include a peripheral conductive adhesive 2912, which is defined as a thermally conductive material for holding components in place. For example, the peripheral conductive adhesive 2912 can include gel, thermally conductive epoxy, or thermally conductive polymer. For further example, the peripheral conductive adhesive 2912 can attach the inner heat shield 2924 to the topside of the bottom substrate 2904. For specific example, the peripheral conductive adhesive 2912 can attach the inner heat shield 2924 to the peripheral thermal via 2906 within the bottom substrate 2904.

The integrated circuit packaging system 2800 can include the inner heat shield 2924 over the bottom integrated circuit 2902 with the inner heat shield 2924 connected to the peripheral thermal via 2906. For example, the inner heat shield 2924 can represent a solid plate or can include a plate hole 2914.

The plate hole 2914 is defined as an opening on the inner heat shield 2924. For example, the inner heat shield 2924 can include multiple numbers of openings for the plate hole 2914. For further example, the plate hole 2914 can come in shapes of circle, triangle, square, or a combination thereof. For a specific example, the inner heat shield 2924 can have the plate hole 2914 with the inner heat shield 2924 between the bottom integrated circuit 2902 and a top integrated circuit 2916. More specifically, the inner heat shield 2924 having the plate hole 2914 can dissipate heat and can stabilize and lock an inner thermal adhesive 2918 applied over the inner heat shield 2924 between the bottom integrated circuit 2902 and the top integrated circuit 2916.

The inner heat shield 2924 can include a foot 2934. The peripheral conductive adhesive 212 can connect the foot 2934 to the peripheral thermal via 2906. The inner heat shield 2924 can include a peripheral leg 2936 extending from the foot 2934. A top planar portion 2932 of the inner heat shield 2924 can extend from the peripheral leg 2936 with the topside of the top planar portion 2932 exposed. For another example, the top planar portion 2932 can be parallel with the topside of the bottom substrate 2904.

An inner support leg 2938 can extend from the top planar portion 2932 of the inner heat shield 2924. The peripheral leg 2936 and the inner support leg 2938 can connect to the top planar portion 2932 in an obtuse angle with the obtuse angle facing towards the bottom substrate 2904. For example, the inner support leg 2938 can be greater than half of the length of the peripheral leg 2936.

A central planar portion 2940 of the inner heat shield 2924 can extend from the inner support leg 2938. The central planar portion 2940 can extend over the bottom integrated circuit 2902 to connect to the inner support leg 2938 on the opposite end of the inner heat shield 2924.

It has been discovered that placing the inner heat shield 2924 on the bottom substrate 2904 provides better manufacturability of the integrated circuit packaging system 2800. By focusing the placement of the inner heat shield 2924 on the bottom substrate 2904, the production speed increases, thus, lowering the production cost.

The integrated circuit packaging system 2800 can include the inner thermal adhesive 2918, which is defined as a single structure that is thermally conductive material for holding components in place. For example, the inner thermal adhesive 2918 can include gel, thermally conductive epoxy, or thermally conductive polymer. The inner thermal adhesive 2918 can cover a topside and a bottom side of the central planar portion 2940 of the inner heat shield 2924. More specifically, the inner thermal adhesive 2918 can cover the non-active side of the bottom integrated circuit 2902 and the top integrated circuit 2916.

The integrated circuit packaging system 2800 can include a top substrate 2930, which is defined as a mounting structure for an integrated circuit or other electrical components as well as providing electrical connections between, to, and from the devices mounted thereto. The integrated circuit packaging system 2800 can include the top integrated circuit 2916 mounted over the top substrate 2930. The top integrated circuit 2916 is defined as chip with active circuitry fabricated thereon. For example, the top integrated circuit 2916 can include a flip chip, a wire bonded chip, or a packaged integrated circuit. Continuing with the example, the active side of the top integrated circuit 2916 and the active side of the bottom integrated circuit 2902 can face away from the inner heat shield 2924.

For further example, the top integrated circuit 2916 can be mounted over the top substrate 2930 with a top underfill 2920, which is defined as a structure that provides adhesion and rigidity for mounting an integrated circuit or electrical component on other integrated circuit or electrical component. For example, the top underfill 2920 can include a liquid epoxy mixture that provides rigidity and adhesion.

It has been discovered that having the inner heat shield 2924, between the bottom integrated circuit 2902 and the top integrated circuit 2916, connected to the peripheral thermal via 2906 improves the thermal performance of the integrated circuit packaging system 2800. Having the inner heat shield 2924 embedded between the bottom integrated circuit 2902 and the top integrated circuit 2916 improves efficiency for heat dissipation for both integrated circuits.

It has been also discovered that the inner heat shield 2924 can provide electromagnetic isolation between the bottom integrated circuit 2902 and the top integrated circuit 2916 to avoid electromagnetic interference between the two integrated circuits. The peripheral thermal via 2906 is connected to the peripheral thermal interconnect 2908, which provides further dissipation of heat from the integrated circuit packaging system 2800. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 2800 can include an electrical interconnect 2922, which is defined as a connection interface for electrical connection to other components. For example, the electrical interconnect 2922 can include a bondwire, solder columns, solder balls, or conductive interconnects. For this example, the electrical interconnect 2922 can represent a bondwire for z-interconnect between the top substrate 2930 and the bottom substrate 2904. For illustrative purposes, the electrical interconnect 2922 is drawn as a dotted line to show that the cross-sectional view can show more than one of the electrical interconnect 2922.

The package encapsulation 2926 can be formed over the bottom integrated circuit 2902, the inner heat shield 2924, and the top integrated circuit 2916 with the top planar portion 2932 of the inner heat shield 2924 coplanar with a package topside 2944 of the package encapsulation 2926. The package encapsulation 2926 can cover the top substrate 2930.

The integrated circuit packaging system 2800 can include a stackable integrated circuit 2942, which is defined as chip with active circuitry fabricated thereon. For example, the stackable integrated circuit 2942 can include a flip chip, a wire bonded chip, or a packaged integrated circuit. For further example, the stackable integrated circuit 2942 can be mounted over the topside of the top substrate 2930.

The integrated circuit packaging system 2800 can include a top conductive adhesive 2928, which is defined as a thermally conductive material for holding components in place. For example, the top conductive adhesive 2928 can cover the package topside 2944 of the package encapsulation 2926 and the non-active side of the stackable integrated circuit 2942. For further example, the top heat shield 2802 can be placed on the top conductive adhesive 2928 for thermal conductivity between the inner heat shield 2924 and the top heat shield 2802 through the top conductive adhesive 2928. For another example, the top heat shield 2802 can be placed on the top conductive adhesive 2928 for thermal conductivity between the stackable integrated circuit 2942 and the top heat shield 2802 through the top conductive adhesive 2928.

It has been discovered the connection between the inner heat shield 2924, the peripheral thermal via 2906, the top planar portion 2932, the top conductive adhesive 2928, and the top heat shield 2802 allows the evenly spaced dissipation of heat from the center or interior of the integrated circuit packaging system 2800 to the external environment. This evenly spaced and maximum separation allow maximum thermal conduction path away from the heat generating integrated circuits to the external environment.

Figure 30:
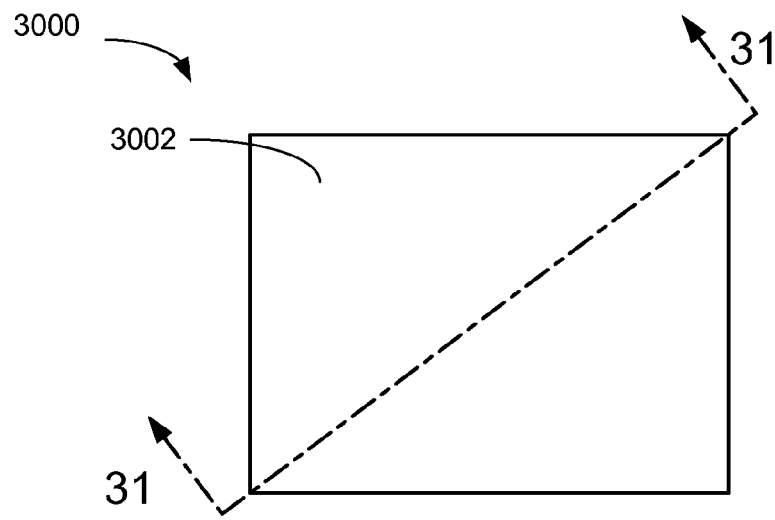
FIG. 30 is a top view of an integrated circuit packaging system in an eleventh embodiment of the present invention.

Referring now to FIG. 30, therein is shown a top view of an integrated circuit packaging system 3000 in an eleventh embodiment of the present invention. The integrated circuit packaging system 3000 can include a top heat shield 3002, which is defined as a conductive structure that transfers heat generated within the integrated circuit packaging system 3000 to the external environment. The term "external" refers to outside the integrated circuit packaging system 3000.

Figure 31:
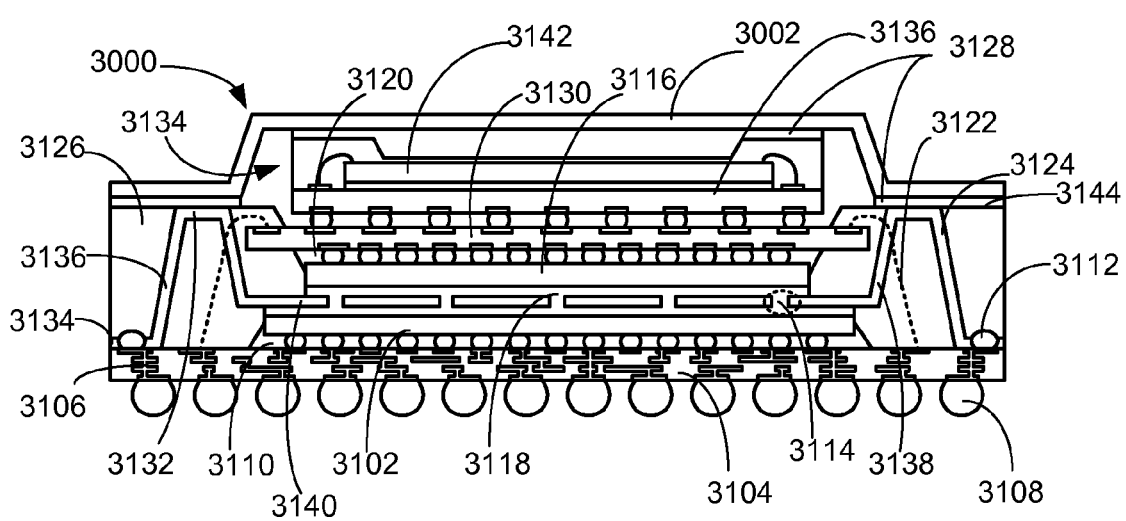
FIG. 31 is a cross-sectional view of the integrated circuit packaging system along the line 31-31 of FIG. 30.

Referring now to FIG. 31, therein is shown a cross-sectional view of the integrated circuit packaging system 3000 along the line 31-31 of FIG. 30. The integrated circuit packaging system 3000 can include a package encapsulation 3126. The package encapsulation 3126 is defined as a cover surrounding and protecting the contents in the integrated circuit packaging system 3000 from the environment and hermetically seals the contents internal to the integrated circuit packaging system. The package encapsulation 3126 can be an epoxy molding, protective molding, or encasement structure.

The integrated circuit packaging system 3000 can include an inner heat shield 3124, which is defined as a conductive structure that transfers heat generated within the integrated circuit packaging system 3000 to the external environment. For example, the inner heat shield 3124 can include a heat spreader or an EMI shield. The integrated circuit packaging system 3000 can in include a bottom integrated circuit 3102 on a bottom substrate 3104 having a peripheral thermal via 3106 connected to a peripheral thermal interconnect 3108.

The bottom substrate 3104 is defined as a mounting structure for an integrated circuit or other electrical components as well as providing electrical connections between, to, and from the devices mounted thereto. For example, the bottom integrated circuit 3102 can be mounted over the topside of the bottom substrate 3104.

The bottom integrated circuit 3102 is defined as chip with active circuitry fabricated thereon. For example, the bottom integrated circuit 3102 can include a flip chip, a wire bonded chip, or a packaged integrated circuit. For further example, the bottom integrated circuit 3102 can be mounted over the bottom substrate 3104 with a bottom underfill 3110, which is defined as a structure that provides adhesion and rigidity for mounting an integrated circuit or electrical component on other integrated circuit or electrical component. For example, the bottom underfill 3110 can include a liquid epoxy mixture that provides rigidity and adhesion.

The peripheral thermal via 3106 is defined as a hole filled with electrically conductive material that provides a thermal path, a conductive path, or a combination thereof. For example, the peripheral thermal via 3106 can support the ground connection for the inner heat shield 3124. The peripheral thermal interconnect 3108 is defined as a connection interface for thermal connection to other components. For example, the peripheral thermal interconnect 3108 can include solder columns, solder balls, or conductive interconnects.

The integrated circuit packaging system 3000 can include a peripheral conductive adhesive 3112, which is defined as a thermally conductive material for holding components in place. For example, the peripheral conductive adhesive 3112 can include gel, thermally conductive epoxy, or thermally conductive polymer. For further example, the peripheral conductive adhesive 3112 can attach the inner heat shield 3124 to the topside of the bottom substrate 3104. For specific example, the peripheral conductive adhesive 3112 can attach the inner heat shield 3124 to the peripheral thermal via 3106 within the bottom substrate 3104.

The integrated circuit packaging system 3000 can include the inner heat shield 3124 over the bottom integrated circuit 3102 with the inner heat shield 3124 connected to the peripheral thermal via 3106. For example, the inner heat shield 3124 can represent a solid plate or can include a plate hole 3114.

The plate hole 3114 is defined as an opening on the inner heat shield 3124. For example, the inner heat shield 3124 can include multiple numbers of openings for the plate hole 3114. For further example, the plate hole 3114 can come in shapes of circle, triangle, square, or a combination thereof. For a specific example, the inner heat shield 3124 can have the plate hole 3114 with the inner heat shield 3124 between the bottom integrated circuit 3102 and a top integrated circuit 3116. More specifically, the inner heat shield 3124 having the plate hole 3114 can dissipate heat and can stabilize and lock an inner thermal adhesive 3118 applied over the inner heat shield 3124 between the bottom integrated circuit 3102 and the top integrated circuit 3116.

The inner heat shield 3124 can include a foot 3134. The peripheral conductive adhesive 212 can connect the foot 3134 to the peripheral thermal via 3106. The inner heat shield 3124 can include a peripheral leg 3136 extending from the foot 3134. A top planar portion 3132 of the inner heat shield 3124 can extend from the peripheral leg 3136 with the topside of the top planar portion 3132 exposed. For another example, the top planar portion 3132 can be parallel with the topside of the bottom substrate 3104.

An inner support leg 3138 can extend from the top planar portion 3132 of the inner heat shield 3124. The peripheral leg 3136 and the inner support leg 3138 can connect to the top planar portion 3132 in an obtuse angle with the obtuse angle facing towards the bottom substrate 3104. For example, the inner support leg 3138 can be greater than half of the length of the peripheral leg 3136.

A central planar portion 3140 of the inner heat shield 3124 can extend from the inner support leg 3138. The central planar portion 3140 can extend over the bottom integrated circuit 3102 to connect to the inner support leg 3138 on the opposite end of the inner heat shield 3124.

It has been discovered that placing the inner heat shield 3124 on the bottom substrate 3104 provides better manufacturability of the integrated circuit packaging system 3000. By focusing the placement of the inner heat shield 3124 on the bottom substrate 3104, the production speed increases, thus, lowering the production cost.

The integrated circuit packaging system 3000 can include the inner thermal adhesive 3118, which is defined as a single structure that is thermally conductive material for holding components in place. For example, the inner thermal adhesive 3118 can include gel, thermally conductive epoxy, or thermally conductive polymer. The inner thermal adhesive 3118 can cover a topside and a bottom side of the central planar portion 3140 of the inner heat shield 3124. More specifically, the inner thermal adhesive 3118 can cover the non-active side of the bottom integrated circuit 3102 and the top integrated circuit 3116.

The integrated circuit packaging system 3000 can include a top substrate 3130, which is defined as a mounting structure for an integrated circuit or other electrical components as well as providing electrical connections between, to, and from the devices mounted thereto. The integrated circuit packaging system 3000 can include the top integrated circuit 3116 mounted over the top substrate 3130. The top integrated circuit 3116 is defined as chip with active circuitry fabricated thereon. For example, the top integrated circuit 3116 can include a flip chip, a wire bonded chip, or a packaged integrated circuit. Continuing with the example, the active side of the top integrated circuit 3116 and the active side of the bottom integrated circuit 3102 can face away from the inner heat shield 3124.

For further example, the top integrated circuit 3116 can be mounted over the top substrate 3130 with a top underfill 3120, which is defined as a structure that provides adhesion and rigidity for mounting an integrated circuit or electrical component on other integrated circuit or electrical component. For example, the top underfill 3120 can include a liquid epoxy mixture that provides rigidity and adhesion.

It has been discovered that having the inner heat shield 3124, between the bottom integrated circuit 3102 and the top integrated circuit 3116, connected to the peripheral thermal via 3106 improves the thermal performance of the integrated circuit packaging system 3000. Having the inner heat shield 3124 embedded between the bottom integrated circuit 3102 and the top integrated circuit 3116 improves efficiency for heat dissipation for both integrated circuits.

It has been also discovered that the inner heat shield 3124 can provide electromagnetic isolation between the bottom integrated circuit 3102 and the top integrated circuit 3116 to avoid electromagnetic interference between the two integrated circuits. The peripheral thermal via 3106 is connected to the peripheral thermal interconnect 3108, which provides further dissipation of heat from the integrated circuit packaging system 3000. Improving the thermal performance of the integrated circuits increases board level reliability and performance of the semiconductor device. The thermally-enhanced package design of the present invention can be applied to various semiconductor devices, thus, lowering the production cost.

The integrated circuit packaging system 3000 can include an electrical interconnect 3122, which is defined as a connection interface for electrical connection to other components. For example, the electrical interconnect 3122 can include a bondwire, solder columns, solder balls, or conductive interconnects. For this example, the electrical interconnect 3122 can represent a bondwire for z-interconnect between the top substrate 3130 and the bottom substrate 3104. For illustrative purposes, the electrical interconnect 3122 is drawn as a dotted line to show that the cross-sectional view can show more than one of the electrical interconnect 3122.

The package encapsulation 3126 can be formed over the bottom integrated circuit 3102, the inner heat shield 3124, and the top integrated circuit 3116 with the top planar portion 3132 of the inner heat shield 3124 coplanar with a package topside 3144 of the package encapsulation 3126. The package encapsulation 3126 can cover the top substrate 3130.

The integrated circuit packaging system 3000 can include a stackable integrated circuit 3142, which is defined as chip with active circuitry fabricated thereon. For example, the stackable integrated circuit 3142 can include a flip chip, a wire bonded chip, or a packaged integrated circuit. For further example, the stackable integrated circuit 3142 can be mounted over the topside of a stackable substrate 3136, which is defined as a mounting structure for an integrated circuit or other electrical components as well as providing electrical connections between, to, and from the devices mounted thereto.

The integrated circuit packaging system 3000 can include a stackable package 3134 having the stackable integrated circuit 3142 mounted over the stackable substrate 3136. The stackable package 3134 is defined as a packaged integrated circuit that can be mounted on other package or structures, or receive other packages.

The integrated circuit packaging system 3000 can include a top conductive adhesive 3128, which is defined as a thermally conductive material for holding components in place. For example, the top conductive adhesive 3128 can cover the package topside 3144 of the package encapsulation 3126 and the active side of the stackable integrated circuit 3142. For further example, the top conductive adhesive 3128 can be on the exposed active side of the stackable integrated circuit 3142. For a different example, the stackable package 3134 can fully encapsulate the stackable integrated circuit 3142. As a result, the top conductive adhesive 3128 can be on the topside of the stackable package 3134.

For another example, the top heat shield 3002 can be placed on the top conductive adhesive 3128 for thermal conductivity between the inner heat shield 3124 and the top heat shield 3002 through the top conductive adhesive 3128. For different example, the top heat shield 3002 can be placed on the top conductive adhesive 3128 for thermal conductivity between the stackable integrated circuit 3142 and the top heat shield 3002 through the top conductive adhesive 3128.

It has been discovered the connection between the inner heat shield 3124, the peripheral thermal via 3106, the top planar portion 3132, the top conductive adhesive 3128, and the top heat shield 3002 allows the evenly spaced dissipation of heat from the center or interior of the integrated circuit packaging system 3000 to the external environment. This evenly spaced and maximum separation allow maximum thermal conduction path away from the heat generating integrated circuits to the external environment.

Figure 32:
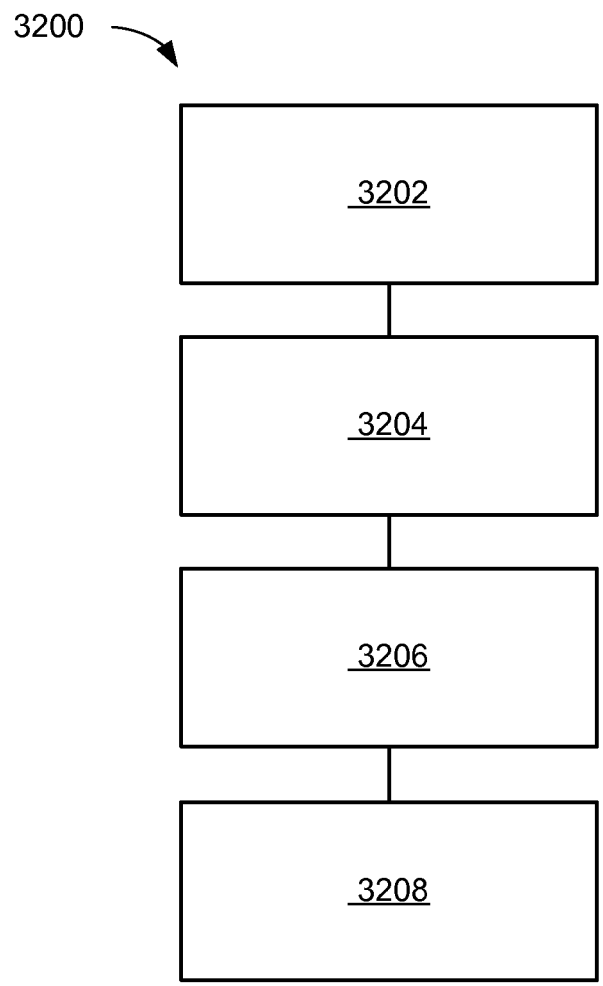
FIG. 32 is a flow chart of a method of manufacture of an integrated circuit packaging system in a further embodiment of the present invention.

Referring now to FIG. 32, therein is shown a flow chart of a method 3200 of manufacture of an integrated circuit packaging system in a further embodiment of the present invention. The method 3200 includes: mounting a bottom integrated circuit on a bottom substrate having a peripheral thermal via connected to a peripheral thermal interconnect in a block 3202; mounting an inner heat shield, having a top planar portion, over the bottom integrated circuit with the inner heat shield connected to the peripheral thermal via in a block 3204; mounting a top integrated circuit over the inner heat shield in a block 3206; and forming a package encapsulation over the bottom integrated circuit, the inner heat shield, and the top integrated circuit with a top planar portion exposed only at each corners of a package topside of the package encapsulation in a block 3208.

Thus, it has been discovered that the integrated circuit packaging system of the present invention furnishes important and heretofore unknown and unavailable solutions, capabilities, and functional aspects for an integrated circuit packaging system with encapsulation. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    mounting a bottom integrated circuit on a bottom substrate having a peripheral thermal via connected to a peripheral thermal interconnect;
    mounting an inner heat shield, having a top planar portion, over the bottom integrated circuit with the inner heat shield connected to the peripheral thermal via, the inner heat shield having a central planar portion with a plate hole with the central planar portion between the bottom integrated circuit and the top integrated circuit;
    mounting a top integrated circuit over the inner heat shield; and
    forming a package encapsulation over the bottom integrated circuit, the inner heat shield, and the top integrated circuit with the top planar portion exposed only at each corners of a package topside of the package encapsulation.

2. The method as claimed in claim 1 wherein mounting the inner heat shield includes mounting the inner heat shield having a horizontal step with a top substrate mounted over the horizontal step.

3. The method as claimed in claim 1 further comprising:
    applying an inner thermal adhesive on and through the inner heat shield with the inner thermal adhesive on the bottom integrated circuit; and wherein:
 mounting the top integrated circuit includes mounting the top integrated circuit on the inner thermal adhesive.

4. The method as claimed in claim 1 wherein mounting the inner heat shield includes mounting the inner heat shield having a peripheral leg extending from a foot of the inner heat shield to the top planar portion and an inner support leg extending from the top planar portion to a central planar portion.

5. A method of manufacture of an integrated circuit packaging system comprising:
 mounting a bottom integrated circuit on a bottom substrate having a peripheral thermal via connected to a peripheral thermal interconnect;
 mounting an inner heat shield over the bottom integrated circuit with the inner heat shield connected to and directly over the peripheral thermal via, the inner heat shield having a central planar portion with a plate hole with the central planar portion between the bottom integrated circuit and the top integrated circuit;
 applying an inner thermal adhesive over the inner heat shield between the bottom integrated circuit and the top integrated circuit;
 mounting a top integrated circuit over the inner thermal adhesive; and
 forming a package encapsulation over the bottom integrated circuit, the inner heat shield, and the top integrated circuit with a top planar portion of the inner heat shield exposed only at each corners of a package topside of the package encapsulation.

6. The method as claimed in claim 5 wherein mounting the inner heat shield includes mounting the inner heat shield having an inner grounding leg, the inner grounding leg connected to an inner thermal interconnect through an inner thermal via.

7. The method as claimed in claim 5 further comprising forming an inner package with an active side of the top integrated circuit on the inner thermal adhesive.

8. The method as claimed in claim 5 further comprising:
 forming an inner package having a top thermal interconnect embedded in the inner package; and
 connecting the inner package to the inner heat shield with an inner conductive adhesive.

9. The method as claimed in claim 5 further comprising mounting a top heat shield over the package capsulation, the top heat shield connected to the inner heat shield through a top conductive adhesive.

10. An integrated circuit packaging system comprising:
 a bottom integrated circuit on a bottom substrate having a peripheral thermal via connected to a peripheral thermal interconnect;
 an inner heat shield, having a top planar portion, over the bottom integrated circuit with the inner heat shield connected to the peripheral thermal via, the inner heat shield having a central planar portion with a plate hole with the central planar portion between the bottom integrated circuit and the top integrated circuit;
 a top integrated circuit over the inner heat shield; and
 a package encapsulation over the bottom integrated circuit, the inner heat shield, and the top integrated circuit with the top planar portion exposed only at each corners of a package topside of the package encapsulation.

11. The system as claimed in claim 10 wherein the inner heat shield having a horizontal step with a top substrate mounted over the horizontal step.

12. The system as claimed in claim 10 further comprising:
 an inner thermal adhesive on and through the inner heat shield with the inner thermal adhesive on the bottom integrated circuit; and
wherein:
 the top integrated circuit on the inner thermal adhesive.

13. The system as claimed in claim 10 wherein the inner heat shield having a peripheral leg extending from a foot to the top planar portion and an inner support leg extending from the top planar portion to a central planar portion.

14. The system as claimed in claim 10 further comprising:
 an inner thermal adhesive over the inner heat shield between the bottom integrated circuit and the top integrated circuit; and
 the top integrated circuit over the inner thermal adhesive.

15. The system as claimed in claim 14 wherein the inner heat shield having an inner grounding leg, the inner grounding leg connected to an inner thermal interconnect through an inner thermal via.

16. The system as claimed in claim 14 further comprising an inner package with an active side of the top integrated circuit on the inner thermal adhesive.

17. The system as claimed in claim 14 further comprising:
 an inner package having a top thermal interconnect embedded in the inner package; and
 the inner package connected to the inner heat shield with an inner conductive adhesive.

18. The system as claimed in claim 14 further comprising a top heat shield over the package capsulation, the top heat shield connected to the inner heat shield through a top conductive adhesive.

\* \* \* \* \*